(12) United States Patent
Miyata et al.

(10) Patent No.: US 7,599,042 B2
(45) Date of Patent: Oct. 6, 2009

(54) COATING AND DEVELOPING APPARATUS, SUBSTRATE PROCESSING METHOD AND COMPUTER-READABLE RECORDING MEDIUM

(75) Inventors: Akira Miyata, Koshi (JP); Tomohiro Kaneko, Koshi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 12/179,014

(22) Filed: Jul. 24, 2008

(65) Prior Publication Data
US 2009/0041926 A1      Feb. 12, 2009

(30) Foreign Application Priority Data
Aug. 8, 2007     (JP) .............................. 2007-207109

(51) Int. Cl.
G03B 27/32     (2006.01)
G03D 5/00      (2006.01)
G06F 19/00     (2006.01)

(52) U.S. Cl. .......................... 355/27; 396/611; 700/100

(58) Field of Classification Search .................... 355/27; 396/611; 700/100; 118/58
See application file for complete search history.

(56) References Cited

U.S. PATENT DOCUMENTS

2007/0016320 A1*   1/2007   Higashi et al. .............. 700/100

* cited by examiner

*Primary Examiner*—Peter B Kim
(74) *Attorney, Agent, or Firm*—Oblon, Spivak, McClelland, Maier & Neustadt, L.L.P.

(57) ABSTRACT

With regard to a group of substrates preceding a substrate of which residence time is under calculation, a time t1 and a time t2 are calculated, t1 being a time interval from a time point in which a substrate B1 under the consideration has become ready from being transferred out from a wait module to a time point in which a heating module used for the substrate B1 has been ready for processing the substrate B1, t2 being a time interface from a time on in which the substrate B1 under calculation has been transferred out from the wait module to a time point of reaching the heating module used for the substrate B1, and a waiting time t of the substrate B1 in the wait module is calculated according to t=t1−t2.

17 Claims, 13 Drawing Sheets

FIG.7

| CYCLE | PEB1 | PEB2 | PEB3 | PEB4 |
|---|---|---|---|---|
| n | | | | |
| n+1 | | | | A21 |
| n+2 | | | | |
| n+3 | A22 | A23 | | |
| n+4 | | | A24 | |
| n+5 | | | | |
| n+6 | | | | A25 |
| n+7 | | | | |
| n+8 | Temperature Stabilization | | | |
| n+9 | | Temperature Stabilization | | |
| n+10 | | | | |
| n+11 | | | Temperature Stabilization | Temperature Stabilization |
| n+12 | | | | |
| n+13 | | | | |
| n+14 | B1 | | | |
| n+15 | | B2 | B3 | |
| n+16 | | | | |
| n+17 | | | | B4 |
| n+18 | | | | |
| n+19 | | | | |
| n+20 | | | | |
| n+21 | B5 | | | |
| n+22 | | B6 | B7 | B8 |
| n+23 | | | | |
| n+24 | | | | |
| n+25 | | | | |

FIG.11

| CYCLE | PEB1 | PEB2 | PEB3 | PEB4 |
|---|---|---|---|---|
| n | | | | |
| n+1 | | | | A21 |
| n+2 | | A23 | | A21 |
| n+3 | A22 | A23 | A24 | |
| n+4 | A22 | A23 | A24 | A25 |
| n+5 | A22 | A23 | A24 | A25 |
| n+6 | A22 | A23 | A24 | A25 |
| n+7 | A22 | A23 | A24 | A25 |
| n+8 | Temperature Stabilization | A23 | A24 | A25 |
| n+9 | Temperature Stabilization | Temperature Stabilization | A24 | A25 |
| n+10 | | Temperature Stabilization | Temperature Stabilization | A25 |
| n+11 | | | Temperature Stabilization | Temperature Stabilization |
| n+12 | | | | Temperature Stabilization |
| n+13 | | | | |
| n+14 | | | | |
| n+15 | | | | |
| n+16 | | | | |
| n+17 | B1 | | | |
| n+18 | B1 | B2 | | |
| n+19 | B1 | B2 | B3 | |
| n+20 | B1 | B2 | B3 | B4 |
| n+21 | B1 | B2 | B3 | B4 |
| n+22 | B1 | B2 | B3 | B4 |
| n+23 | | B2 | B3 | B4 |
| n+24 | | B2 | B3 | B4 |
| n+25 | B5 | B6 | B7 | B4 |
| n+26 | B5 | B6 | B7 | B8 |
| n+27 | B5 | B6 | B7 | B8 |
| n+28 | B5 | B6 | B7 | B8 |
| n+29 | | | | B8 |

FIG12

| | Waiting Time in BM (Second) | Vacant Time of PEB (Second) | | | | | | Start Time of Processing Wafer A | End Time of Processing Wafer B | Difference |
|---|---|---|---|---|---|---|---|---|---|---|
| | | PEB1 | PEB2 | PEB3 | PEB4 | PEB5 | PEB6 | | | |
| Case 1 | 194 | 231 (141) | 226 (136) | 225 (135) | 231 (135) | 231 (135) | 231 (135) | 13:40:17 | 14:20:42 | 0:40:25 |
| Case 2 | 112 | 147 (57) | 148 (58) | 147 (57) | 147 (52) | 147 (51) | 147 (51) | 21:47:41 | 22:26:42 | 0:39:01 |
| Improvement (Second) | 82 | 84 | 78 | 78 | 83 | 84 | 84 | / | / | 84 (Second) |

US 7,599,042 B2

COATING AND DEVELOPING APPARATUS, SUBSTRATE PROCESSING METHOD AND COMPUTER-READABLE RECORDING MEDIUM

CROSS-REFERENCE TO RELATED APPLICATIONS

The present invention is based on Japanese priority application 2007-207109 filed on Aug. 8, 2007, the entire contents of which are incorporated herein by reference.

BACKGROUND OF THE INVENTION

The present invention generally relates to substrate processing and more particularly to a coating and developing apparatus that applies coating of a resist liquid and developing after exposure upon a substrate such as a semiconductor wafer or a glass substrate for liquid crystal display devices. Further, the present invention relates to substrate processing method and a computer-readable recording medium recorded with program code means of such a substrate processing method.

Generally, a coating and developing apparatus is used to carry out the operation of coating and developing of a resist film. Thus, a coating and developing apparatus carries out a series of processing of: coating a resist film upon a substrate of a semiconductor device or a substrate of a liquid crystal display (LCD) device; exposing the resist film while using a photomask; and forming a desired resist pattern on the substrate by developing the exposed resist film. Thereby, the coating and developing apparatus is used in the form of a substrate processing system by being connected to an exposure apparatus.

SUMMARY OF THE INVENTION

In a first aspect, there is provided a coating and developing apparatus carrying out coating of a resist film upon a substrate taken out from a carrier fed into a carrier block, said coating and developing apparatus further applying a developing process to a substrate finished with an exposure process in an exposure apparatus, said coating and developing apparatus further carrying out, after processing of substrates of a preceding lot, processing of substrates of a subsequent lot, said coating and developing apparatus comprising:

a wait module in which a substrate coated with a resist film and ready for an exposure process waits for transfer;

a transfer unit transferring said substrate waiting in said wait module to a feed-in port of said exposure apparatus, said transfer unit being further fed with a substrate finished with an exposure process from a feed-out port of said exposure apparatus and transferring to a selected heating module selected from a plurality of heating modules;

a calculation unit calculating, during said processing of substrates of said preceding lot, a timing for transferring out a first substrate of said subsequent lot to be processed with said heating module from said wait module for each of said plurality of heating modules;

a control unit controlling said transfer unit such that a first substrate of said subsequent lot is transferred out from said wait module with a timing calculated with said calculation unit, wherein said calculation unit obtains, for a current heating module included in said plurality of heating modules, a waiting time t defined as a time interval from a time point in which a first substrate B1 of said subsequent lot to be processed by said current module at first has become ready for being transferred out from said wait module to a time point in which said substrate B1 has been transferred out from said wait module, as $$t = t1 - t2,$$

t1 representing a time interval from said time point in which said substrate B1 has become ready for being transferred out from said wait module to a time point in which said current heating module has become ready for processing said substrate B1, t2 representing a time interval from said time point in which said substrate B1 has been transferred out from said wait module to a time point in which said substrate B1 has reached said current heating module, said calculation unit obtaining said time t1 as a sum of:

a predicted residual time t11 representing a time interval in which a substrate A1, which is a substrate of said preceding lot to be processed at last by said current heating module, remains in said exposure apparatus as measured from a first time point in which said substrate B1 has become ready to be transferred out from said wait module, to a time point in which said substrate A1 is transferred to a feed-out port of said exposure apparatus;

and a time interval t12 from a time in which said substrate A1 is transported out from said feed-out port and processed with said current heating module after being transferred thereto, to a time in which said current heating module has become ready for processing said substrate B1 subsequent to said substrate A1, said calculation unit further obtaining said time t2 as a sum of:

a time interval t21 for said substrate B1 being transferred out from said wait module and introduced into said feed-in port of said exposure apparatus;

a time t3 for said substrate B1 residing in said exposure apparatus; and a time t23 for said substrate B1 being transferred out from said exposure apparatus and transferred to said current heating module, said calculation unit further calculating said residual time t3 in said exposure apparatus for each of said substrates that precede said substrate B1 from a time point of being transferred into said exposure apparatus to a time point of being transferred out from said exposure apparatus, said calculation unit calculating said predicted residual time t11 of said substrate A1 in said exposure apparatus as a time that remains after a time interval, measured from a time point in which said substrate B1 is introduced into said exposure apparatus to a time point in which said substrate B1 has become ready for being transferred out from said waiting module, has been subtracted from said residual time t3 of said substrate A1 in said exposure apparatus, said transfer unit transferring out said substrate B1 from said wait module at a time point in which said wait time t has been elapsed from said time point in which said substrate B1 has become ready for being transferred out from said wait module.

In another aspect, the substrate processing method carries out processing of substrates of a current lot subsequent to substrates of a preceding lot by using a coating and developing apparatus, said coating and developing apparatus comprising: a wait module in which a substrate coated with a resist and ready for an exposure process waits for transfer; a transfer unit transferring said substrate waiting in said wait module to a feed-in port of said exposure apparatus, said transfer unit being further transferred with a substrate finished with an exposure apparatus from a feed-out port of said exposure apparatus and transferring to a selected heating module selected from a plurality of heating modules; and a developing module carrying out a developing processing to a substrate heated with said heating module, said substrate processing method comprising the steps of:

calculating, during said processing of substrates of said preceding lot, a timing for transferring out a first substrate of said subsequent lot to be processed with said heating module from said wait module for each of said plurality of heating modules; and transferring out a first substrate of said subsequent lot form said wait module with a timing calculated by said calculating step, wherein said calculating step obtains, for a current heating module included in said plurality of heating modules, a waiting time t defined as a time interval from a time point in which a first substrate B1 of said subsequent lot to be processed by said current module at first has become ready for being transferred out from said wait module to a time point in which said substrate B1 has been transferred out from said wait module, as $t = t1 - t2$, t1 representing a time interval from said time point in which said substrate B1 has become ready for being transferred out from said wait module to a time point in which said current heating module has become ready for processing said substrate B1, t2 representing a time interval from said time point in which said substrate B1 has been transferred out from said wait module to a time point in which said substrate B1 has reached said current heating module, said calculating step obtaining said time t1 as a sum of:

a predicted residual time t11 representing a time interval in which a substrate A1, which is a substrate of said preceding lot to be processed at last by said current heating module, remains in said exposure apparatus as measured from a first time point in which said substrate B1 has become ready to be transferred out from said wait module, to a time point in which said substrate A1 is transferred to a feed-out port of said exposure apparatus; and a time interval t12 from a time in which said substrate A1 is transported out from said feed-out port and processed with said current heating module after being transferred thereto, to a time in which said current heating module has become ready for processing said substrate B1 subsequent to said substrate A1, said calculating step further obtaining said time t2 as a sum of:

a time interval t21 for said substrate B1 being transferred out from said wait module and introduced into said feed-in port of said exposure apparatus;

a time t3 for said substrate B1 residing in said exposure apparatus; and a time t23 for said substrate B1 being transferred out from said exposure apparatus and transferred to said current heating module, said calculating step further calculating said residual time t3 in said exposure apparatus for each of said substrates that precede said substrate B1 from a time point of being transferred into said exposure apparatus to a time point of being transferred out from said exposure apparatus, said calculating step calculating said predicted residual time t11 of said substrate A1 in said exposure apparatus as a time that remains after a time interval, measured from a time point in which said substrate B1 is introduced into said exposure apparatus to a time point in which said substrate B1 has become ready for being transferred out from said waiting module, has been subtracted from said residual time t3 of said substrate A1 in said exposure apparatus, According to the present invention, the residual time t3 of the substrates in the exposure apparatus is calculated based on the load-in time and load-out time of the substrates transferred to and transferred out from the exposure apparatus before the first substrate of the subsequent lot, of which waiting time of the wait module is the subject of calculation. Further, the predicted residual time t11 of the substrate of the preceding lot to be transferred to the heating module to be used for the current substrate is calculated based on the residual time t3. Further, based on the predicted residual time t11, the time t1 from the time point in which the substrate under consideration has become ready for transfer to the time point in which the heating module is ready for the heating is calculated. Further, the time interval t2 for the substrate, of which waiting time is under calculation, to reach the heating module is calculated from the residual time t3, and the residual time t in the wait module is calculated as t1−t2. By controlling the transfer of the substrate out from the wait module based on the residual time t thus calculated, the discrepancy between the time in which the heating process becomes ready in the heating module and the time in which the substrate under consideration reaches the heating module is suppressed, and it becomes possible to reduce the idling time in which the substrate waits in the wait module unnecessarily. As a result, it becomes possible to suppress the problem of degradation of throughput.

BRIEF DESCRIPTION OF THE DRAWINGS

FIG. 7 is a transfer table showing the heating unit to which the wafers are transferred after the exposure process;

FIG. 11 is a transfer table showing the relationship between the temperature stabilization for each heating unit used after the exposure process and the timing of wafer transfer of the subsequent lot according to the related art; and FIG. 12 is a table explaining the effect of the embodiments.

DETAILED DESCRIPTION OF THE PREFERRED EMBODIMENT

Figure 1:
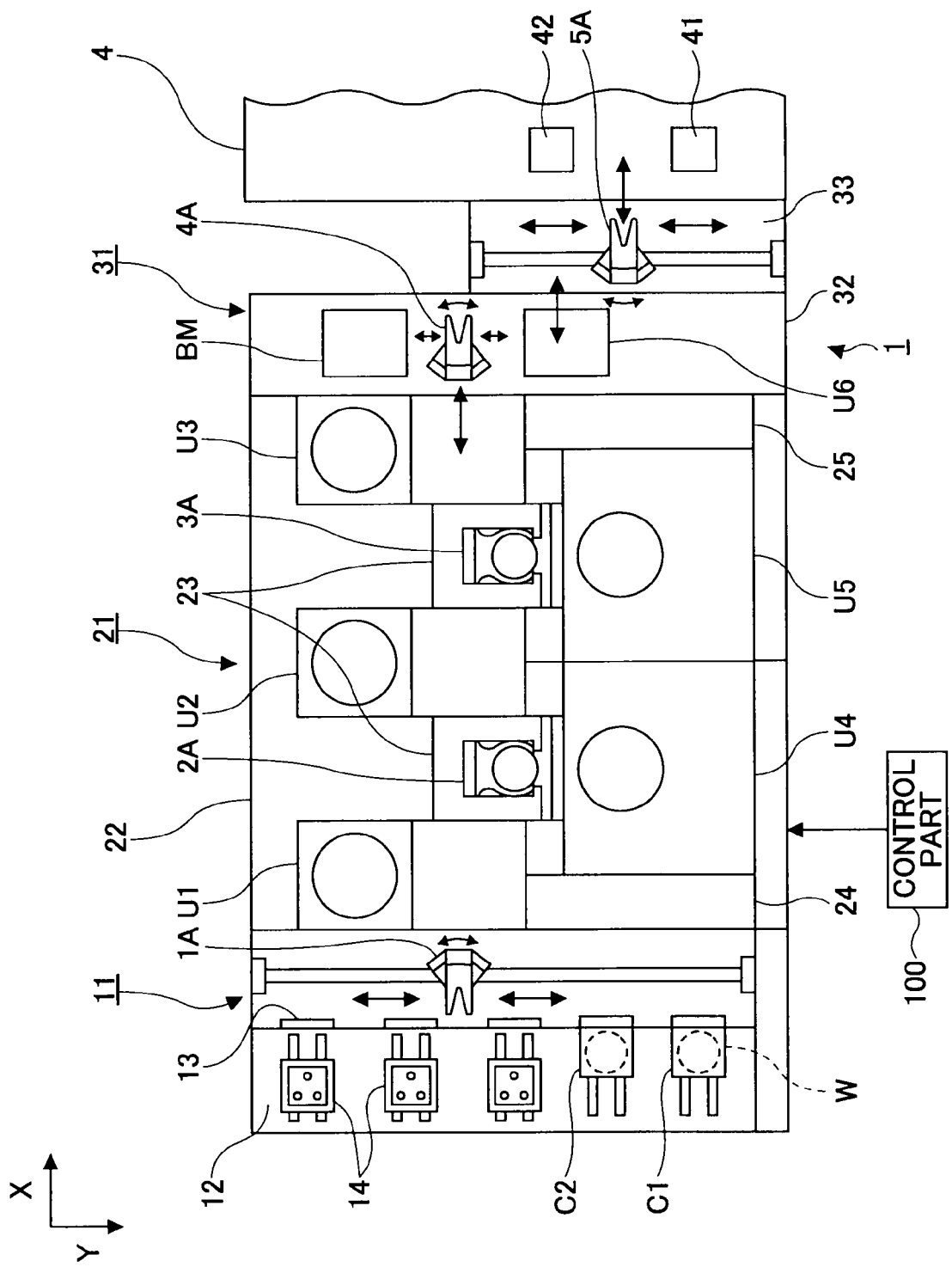
FIG. 1 is a plan view diagram showing a coating and developing apparatus according to a first embodiment.

Generally, a coating and developing apparatus has a construction of disposing a carrier block loaded with a carrier in which semiconductor wafers (referred to hereinafter as "wafer") are loaded, the carrier block further having a transfer arm for transferring a wafer to and from the carrier, a processing block that applies coating of resist or developing to a wafer picked up by the carrier block, and an interface block connected to an exposure apparatus and transferred with the wafer from the processing block, wherein the carrier block, the processing block and the interface block are disposed in series.

After coating of the resist, the wafer is transferred from a high precision cooling module (ICPL) for adjustment of wafer temperature before being introduced into the exposure apparatus and the wafer is then transferred from the ICPL to the exposure apparatus for the exposure process. The wafer finished with the exposure process is transferred to one of plurality of post exposure baking unit (PEB) provided in plural numbers in the coating and developing apparatus via a transfer stage (TRS). There, the substrate is subjected to a baking process and is then processed with a developing process in the developing unit.

Meanwhile, different carriers generally accommodate therein wafers of mutually different lots, and thus, there are cases in which it is necessary to carry out processing, after the wafers of a preceding lot are finished with heating by a PEB as noted above, to change the temperature of a hot plate provided in that PEB in preparation of processing of the wafers of a subsequent lot. Thus, there is provided a buffer module in the front side of the ICPL so as to be able to accommodate a plurality of wafers, and it is constructed such that the wafers of the subsequent lot are retained temporarily in such a buffer module.

In the case of providing such a buffer module, it is advantageous, from the view point of attaining high throughput by reducing the waiting time in the buffer module, to construct such that the first wafer of the subsequent lot is transferred to the current PEB with the same timing in which the temperature change of the hot plate is completed with that PEB. While it is certainly possible to transfer the wafer to the TRS before temperature stabilization of the hot plate in the PEB and hold the wafer in the TRS, such an approach is not desirable because of the fact that, when the wafer stays in the TRS for a long time, it becomes no longer possible to transfer the subsequent wafers to the TRS. In such a case, it becomes necessary to stop the transfer of the subsequent wafers.

Thus, the inventor of the present invention has studied a scheme of the transfer unit taking out the first wafer of the subsequent lot to be transferred to the PEB out from the buffer module subsequent to processing of a preceding lot, such that a waiting time t, defined as the time from a time point P in which it becomes possible for the transfer unit to transfer the foregoing first wafer to the time point in which the wafer is actually transferred out from the buffer module, is determined by calculation such that the first wafer of the subsequent lot is transferred to the PEB with the timing as noted before. Thereby, transfer of the wafer out from the buffer module is attained with the waiting time t determined according to such a scheme. However, this scheme assumed the condition that there exists no wafer of the preceding lot in the buffer module.

While the calculation of the waiting time t will be explained in detail with reference to the first and second embodiments, a brief explanation will be made also herein.

First, a time t1 is calculated as the time from the foregoing time pint P to the time point in which the temperature of the hot plate has been stabilized in the PEB, to which the wafer under calculation with regard to the waiting time is transferred, at a predetermined processing temperature for processing the first wafer of the subsequent lot. Further, a time t2 is calculated as the time for the wafer to reach the PEB after being transferred out from the buffer module. Thereby, the waiting time t is calculated as (t1−t2), and the calculated value is set as the waiting time t.

Here, it should be noted that the time t1 becomes the sum of: a residual time from the foregoing time point P to the time point in which the last wafer of the preceding lot already transferred into the exposure apparatus, is transferred out from the exposure apparatus to the PEB ready for processing the wafer of the preceding lot; a time needed for that wafer to be transferred from the exposure apparatus to the PEB; the time for baking processing in the PEB; and time needed for temperature stabilization in the PEB. Further, the time t2 is given as a sum of: a time for the wafer of the subsequent lot, the waiting time of which is under calculation, is transferred from the buffer module to the exposure apparatus; a residual time of that wafer in the exposure apparatus; and a time for that wafer to be transferred from the exposure apparatus to the PEB.

On the other hand, an exposure apparatus usually does not notify the information about wafer residual time of the preceding lot or wafer residual time of the subsequent lot to the coating and developing apparatus.

Figure 10A:
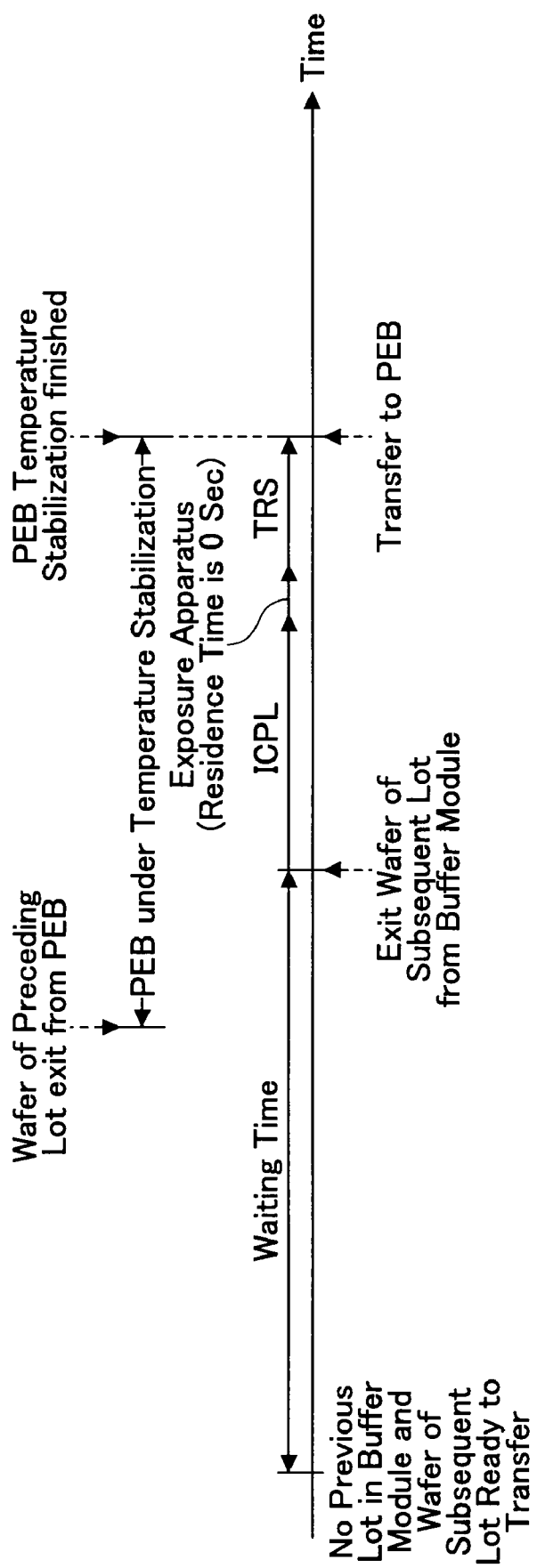
FIGS. 10A and 10B are time charts showing the relationship between the end of temperature stabilization of the heating unit used after exposure and the waiting time according to a related art.

Under the situations noted above, the inventor has studied the possibility of aligning the timing of temperature stabilization in the PEB and the timing of transfer of the first wafer of the subsequent lot to the PEB as shown in FIG. 10A, by determining the waiting time t when calculating the time t1 and the time t2 under the assumption that the residual time of the preceding lot and the residual time of the subsequent lot in the exposure apparatus are 0 seconds, respectively.

Figure 10B:
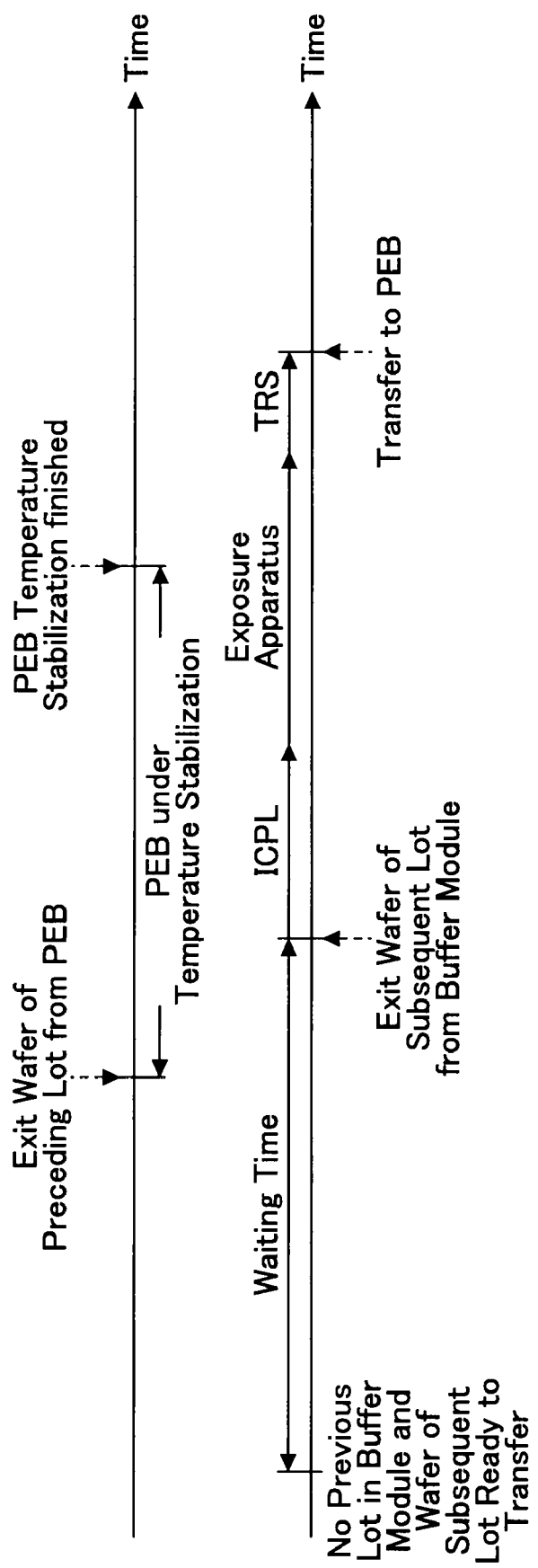

However, the residual times of the preceding lot and the subsequent lot in the exposure apparatus are not 0 seconds in practice, and thus, there arises discrepancy between the timing of temperature stabilization in the PEB and the arrival of the wafer of the subsequent lot at the PEB as shown in FIG. 10B. When this occurs, there arises a situation that the wafer stays in the buffer module for unnecessarily long time, resulting in degradation of the process throughput.

Further, in the side of the PEB, there appears a long waiting time after the completion of the temperature stabilization to the actual wafer transfer as shown in FIG. 11, and there arises waste of electric power for heating the wafer during such a waiting time of the PEB.

The invention to be explained hereinafter with regard to various embodiments is made under such an investigation and has its object of providing a coating and developing apparatus enabling efficient transfer of a substrate out from a wait module in which the substrate coated with resist and ready for an exposure process is waiting in coordination with a time point in which a heating module used for heating the substrate after the exposure process is ready for carrying out the heating process, such that unnecessary waiting time of the substrate in the wait module is reduced. Further, the present invention provides a substrate processing method attaining the foregoing object, and further a computer-readable recording medium recorded with software for executing such a substrate processing method.

First Embodiment

Hereinafter, a coating and developing apparatus 1 according to a first embodiment will be explained with reference to FIGS. 1 and 2.

Figure 2:
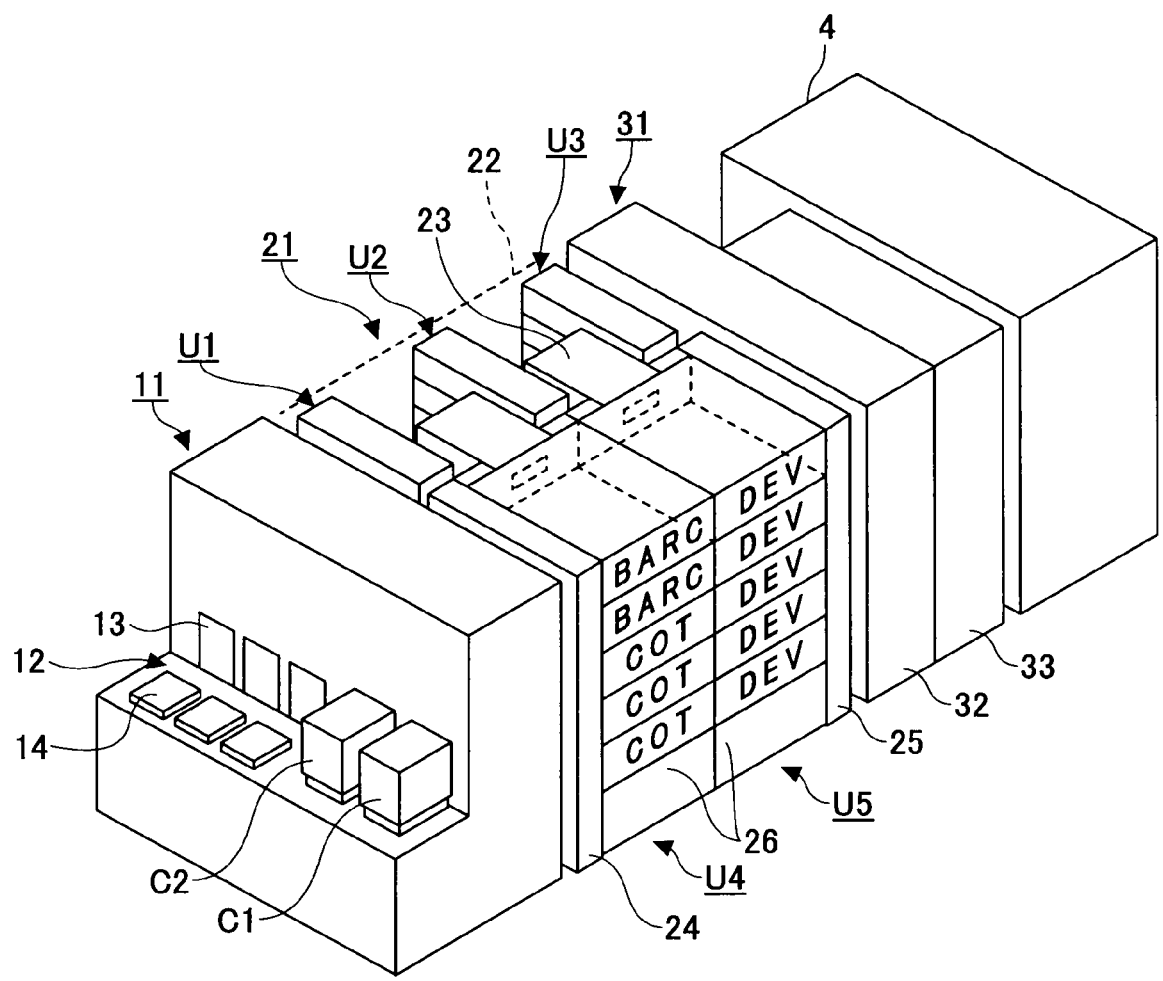
FIG. 2 is a perspective view diagram showing the coating and developing apparatus.

Referring to FIGS. 1 and 2, the coating and developing apparatus 1 includes a carrier block 11 loaded in and loaded out with a carrier C (C1, C2) accommodating therein 25 wafers W, for example, as the substrate to be processed, a carrier station 12 provided with a stage 14 capable of holding a plurality of the carriers C, an open/close part 13 provided to a front wall as viewed from the carrier station 12, and a transfer part 1A for taking out a wafer W from the carrier C via the open/close part 13. It should be noted that the respective carriers C accommodate therein the wafers W of mutually different lots.

Behind the carrier block 11, a processing block 21 is connected in a state surrounded with a casing 22, wherein the processing block 21 is provided with main transfer units 2A and 3A for transferring the wafer W between shelf units U1, U2 and U3 in which heating and cooling units are stacked in multiple stacks and various processing units including a coating and developing unit to be described later, in such a manner that the main transfer units A2 and A3 are disposed alternately. Thus, the shelf units U1, U2 and U3 and the main transfer units 2A and 3A are aligned in a straight line as viewed from the side of the carrier block 11, wherein each connection part is provided with an opening not illustrated for wafer transfer, and thus, the wafer W can move freely through the processing block 21 from the shelf unit U1 at one end to the shelf unit U3 at the other end. Further, it should be noted that the main transfer units 2A and 3A are disposed in the spaces each defined by a surface of two of the shelf units U1, U2 and U3 disposed in the front and rear directions as viewed from the carrier block 11, a surface of the liquid processing unit U4 or U5 to be described later and disposed at the right side of viewed from the carrier block 11, and a compartment wall 23 forming a rear surface at the left side as viewed from the carrier block 11. Thereby, the main transfer units 2A and 3A perform a cyclic transfer of wafers such that a wafer is moved consecutively through a series of predetermined modules in a cyclic manner. Thereby, the wafers are moved consecutively. In the drawing, the reference numerals 24 and 25 represent a temperature and moisture adjusting unit having a temperature adjusting device and a moisture adjusting duct for adjusting temperature and moisture of the processing liquid used in each unit.

Further, as showing in FIG. 2, each of the liquid processing units U4 and U5 has a construction of stacking, on an accommodation part 26 functioning as a space for supplying a chemical liquid such as a coating liquid (resist liquid) or a developing liquid, a coating unit COT, a developing unit DEV, an anti-reflection coating forming unit BARC, and the like, in plural stacks such as 5 stacks. Further, each of the foregoing shelf units U1, U2 and U3 has the construction of stacking various units for preprocessing and post processing of the processing conducted in the liquid processing units U4 and U5 in plural stacks, 10 stacks for example, wherein the stack may include a heating unit (HP) for heating (baking) a wafer W and a cooling unit for cooing a wafer W. Further, the shelf unit U1 includes a transfer unit for transferring a wafer W between the carrier block 11 and the processing block 21, while the shelf unit U3 includes a transfer unit 27 for transferring a wafer W between the processing block 21 and the interface block 31 and post exposure heating units PEB1-PEB4 for heating the wafer W after the exposure process (see FIG. 3), wherein the transfer unit 27 and the PEB1-PEB4 are provided in plural numbers. Each of PEB1-PEB4 includes a hot plate capable of changing the temperature thereof as desired.

At the rear side of the shelf unit U3, there is connected an exposure apparatus 4 via an interface block 31 formed of a first transfer chamber 32 and a second transfer chamber 33.

Figure 3:
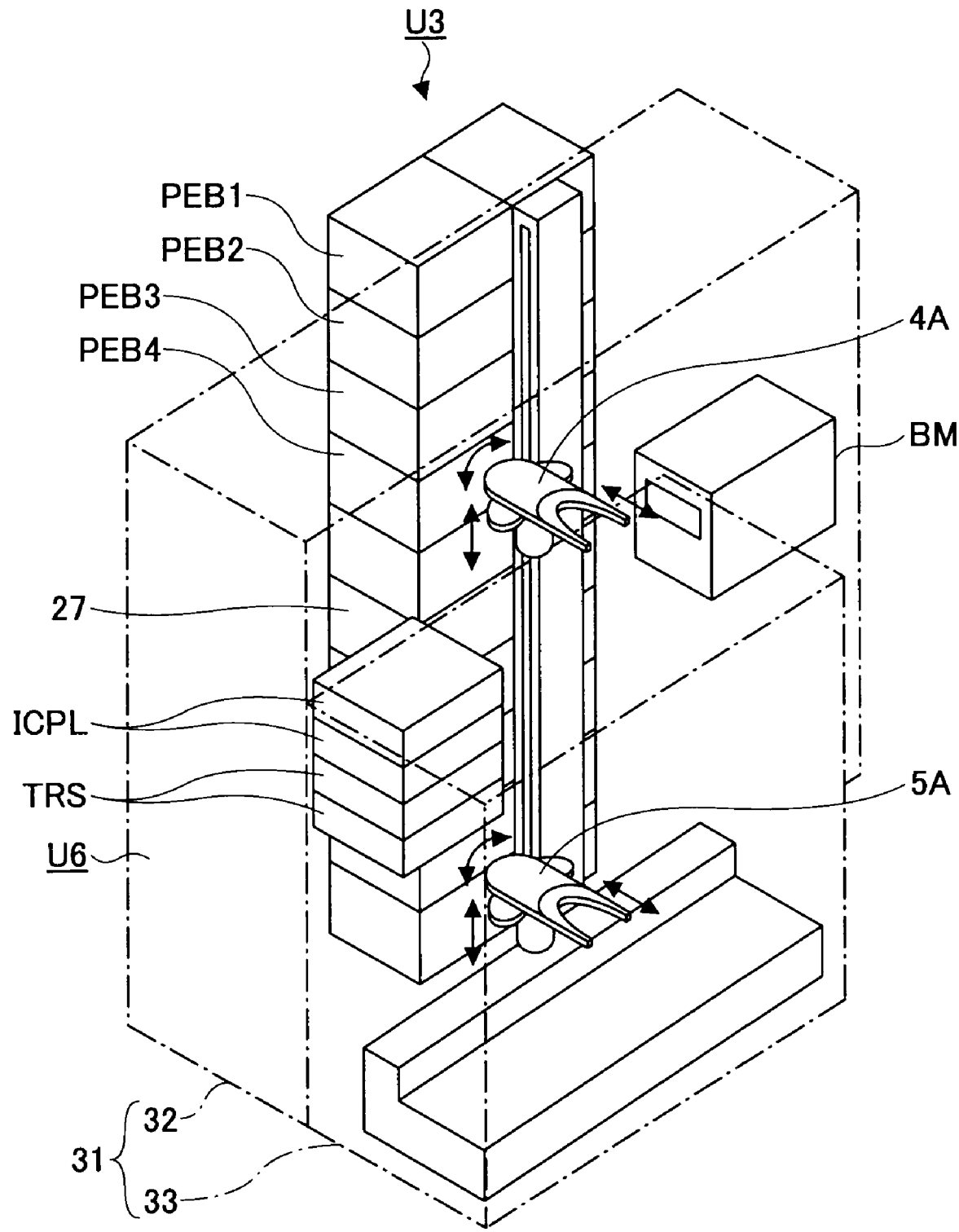
FIG. 3 is an oblique view diagram showing an interface block provided to the coating and developing apparatus.

Hereinafter, the interface block 31 will be explained with reference to FIG. 3. For example, the first transfer chamber 32 is provided with a shelf unit U6, in which a plurality of transfer stages TRS and high precision cooing modules ICPL for adjusting the wafer W to a temperature inside the exposure apparatus 4 are stacked, a buffer module BM, which is a wait module for temporarily staying a plurality of wafers W, and a transfer part 4A, while the second transfer chamber 33 is provided with a transfer part 5A.

The transfer part 4A is constructed so as to be able to access each "module" (a location on which a wafer is placed) of the shelf unit U6 and the shelf unit U3, and the buffer module BM. Further, the transfer part 5A is constructed so as to be able to access any module of the shelf unit U6, so as to be able to transfer a wafer W ready for the exposure process to a feed-in port 41 of the exposure apparatus 4, and so as to be able to transfer the wafer W finished with the exposure process from a feed-out port 42 of the same exposure apparatus 4. Further, the exposure apparatus 4 has a construction of sending out, in the case it is judged that the substrate to be processed is anomalous, a signal indicative thereof to a control part 100.

Hereinafter, the processing units such as the transfer modules, transfer stages and the heating unit will be designated as "module". It should be noted that these modules take a "ready-to-accept" state or "ready-to-feed-out" state when the wafer W is transferred thereto or transferred out therefrom. Thus, when a module has become a ready-to-accept state, this means that the module is ready for accepting a wafer W from a module of the preceding state, while when a module has become a ready-to-feed-out state, this means that the processing of the wafer W in that module has been finished and the wafer W is ready for transferring out therefrom. Further, with regard to the exposure apparatus 4, it should be noted that a wafer W has become the state ready to be taken out from the exposure apparatus 4 when the wafer W is placed upon the feed-out port 42, while when a wafer W has been in the state of ready for being transferred to the feed-in port, the wafer W becomes the state of ready to be transferred to the exposure apparatus 4. Thus, when any of these modules and the exposure apparatus 4 has become a ready-to-accept state or ready-to-feed-out state, there is transmitted an out-ready signal or an in-ready signal to the control part 100, and the control part 100 judges as to the possibility of wafer transfer from a module to another module based on such a ready signal.

Next, explanation will be made on the control part 100.

The control part 100 is formed of a computer, for example, and has a program storage part not illustrated. The program storage part stores the software in the form of a program in which instructions for executing the developing process to be described later are programmed, and the control part 100 controls the operations of the various transfer units by reading out the program. Thereby, the wafer transfer is controlled as will be described later. Such a program is stored into the program storage part in the form recorded to a recording medium, which may be a hard disk, compact disk, magneto-optical disk, memory card, or the like.

The control part 100 is provided with an input display device not illustrated, and with this, it becomes possible for an operator to input a maximum limit time for being used to determine the residence time of the wafer in the exposure apparatus.

Next, an example of the transfer path of the wafer W in the coating and exposure apparatus 1 will be represented.

First, a carrier C accommodating therein the wafers W is loaded upon the loading part 14, and a lid of the carrier C is removed together with the open/close part 13. Thereby, a wafer W is picked upon by the transfer part 1A. Next, the wafer W is transferred to the main transfer unit 2A via a transfer unit (not shown) that constitutes the first stage of the shelf unit U1, and the wafer W is subjected first to a hydrophobizing processing and a cooling processing in one shelf unit of the shelf units U1-U3 as a pre-processing of resist coating. Thereafter, the wafer is coated with a resist liquid by the coating unit COT.

Next, the wafer W is heated (bake processing) by a heating unit PAB that constitutes one shelf unit of the shelf units U1-U3, followed by cooling. Further, the wafer W is transferred to the interface block 31 via the transfer unit 27 of the shelf unit U3, wherein the wafer W is transferred further to the ICPL from the interface block 31 via the transfer part 4A in the event the exposure apparatus 4 is in the ready-to-accept state for the wafer W and there is no other wafer W in the buffer module BM at the same time. In the cases other than the foregoing, the wafer W is transferred to the buffer module BM from the transfer unit 27 via the transfer part 4A for staying therein temporarily, wherein the wafer W is then transferred therefrom to the ICPL by the transfer part 4A. Thereafter, the wafer W is transferred to the feed-in port 41 of the exposure apparatus 4 along a path of ICPL→transfer part 5A, wherein the wafer W is thereafter transferred from the feed-in port 41 to a predetermined location inside the exposure apparatus 4 for the exposure processing.

After the exposure, the wafer W is transferred to the feed-out port 42 and is transferred out therefrom along the path of: transfer part 5A→TRS of the shelf unit U6→one of the PEB1-PEB4 of the shelf unit U3→main transfer unit 3A, wherein the wafer is transferred to the developing unit DEV via the main transfer unit 3A. There, as a result of the development, there is formed a resist mask in the form of a resist pattern. Thereafter, the wafer W is transferred in the order of: main transfer unit 3A→transfer unit of shelf unit U2 main transfer unit 2A→transfer unit of the shelf unit U1→transfer part 1A and is returned to the carrier C on the stage 14 by the transfer part 1A. During this transfer, it should be noted that the control part 100 decides about which of the wafer in the carrier C is to be subjected to the baking processing and which of the PEBs is to be used therefor, before the wafer W is taken out from the carrier C.

Next, the process of determining the waiting time t in the buffer module BM will be explained.

Figure 4:
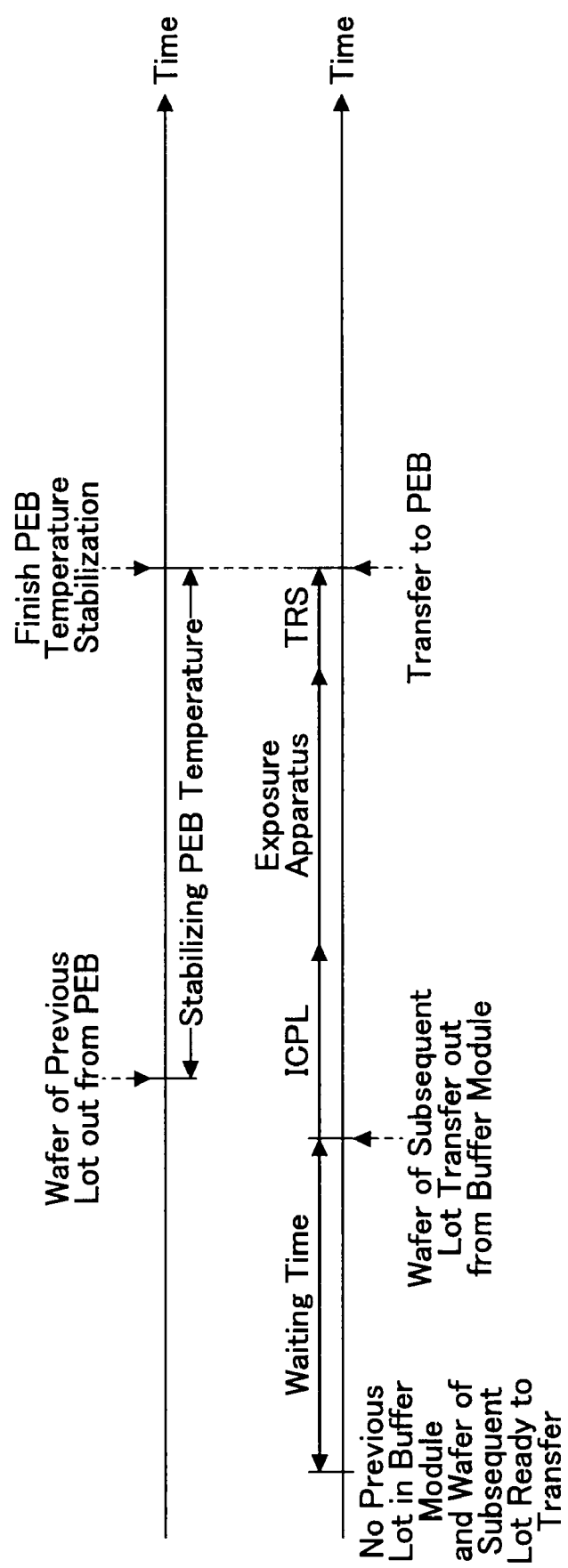
FIG. 4 is a time chart showing the relationship between the timing of transfer of the wafers of a subsequent lot and the timing of completion of temperature stabilization for the heating unit after exposure.
Figure 5:
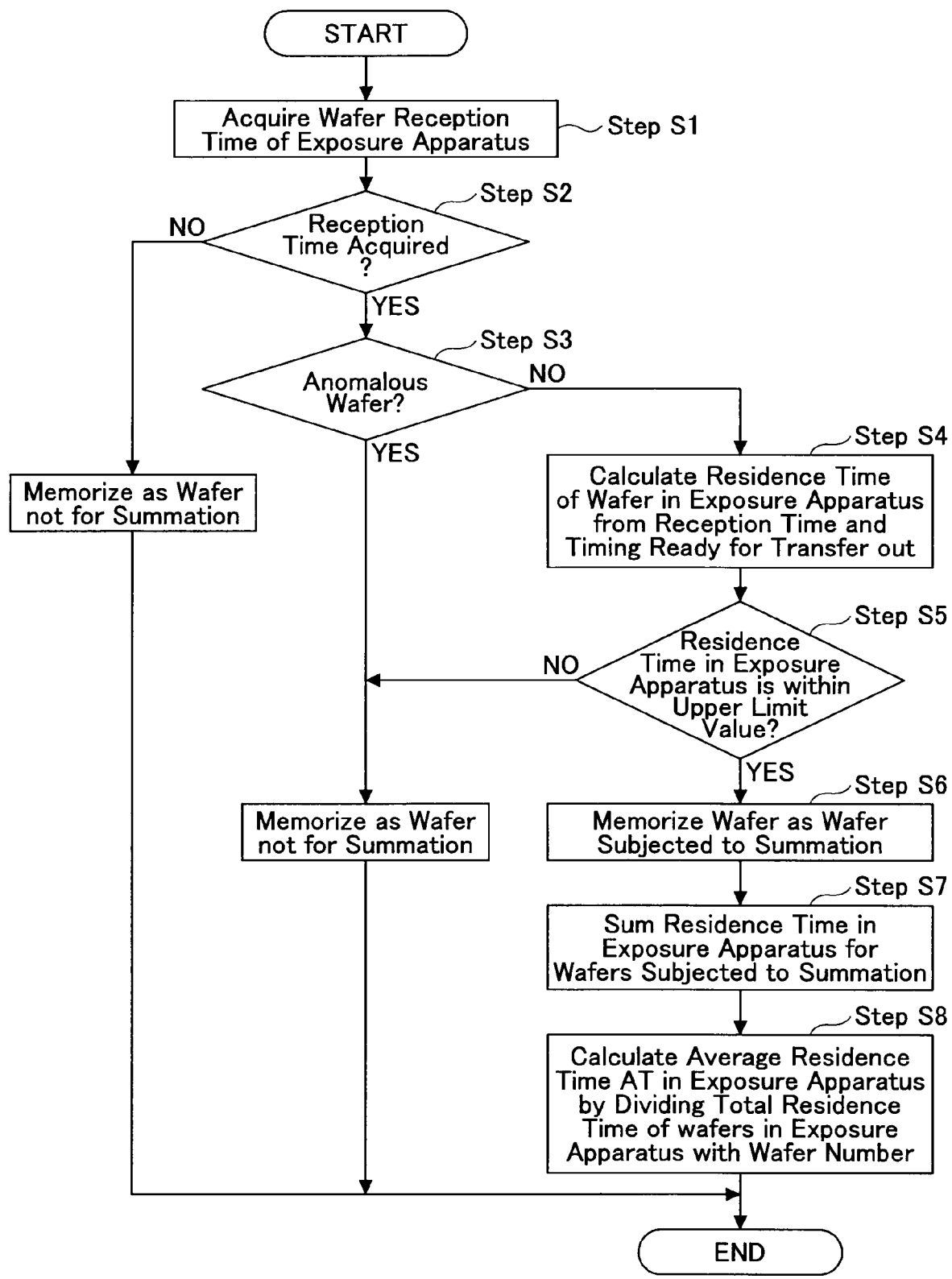
FIG. 5 is a flowchart showing the process of determining the residual time in the exposure apparatus.
Figure 6:
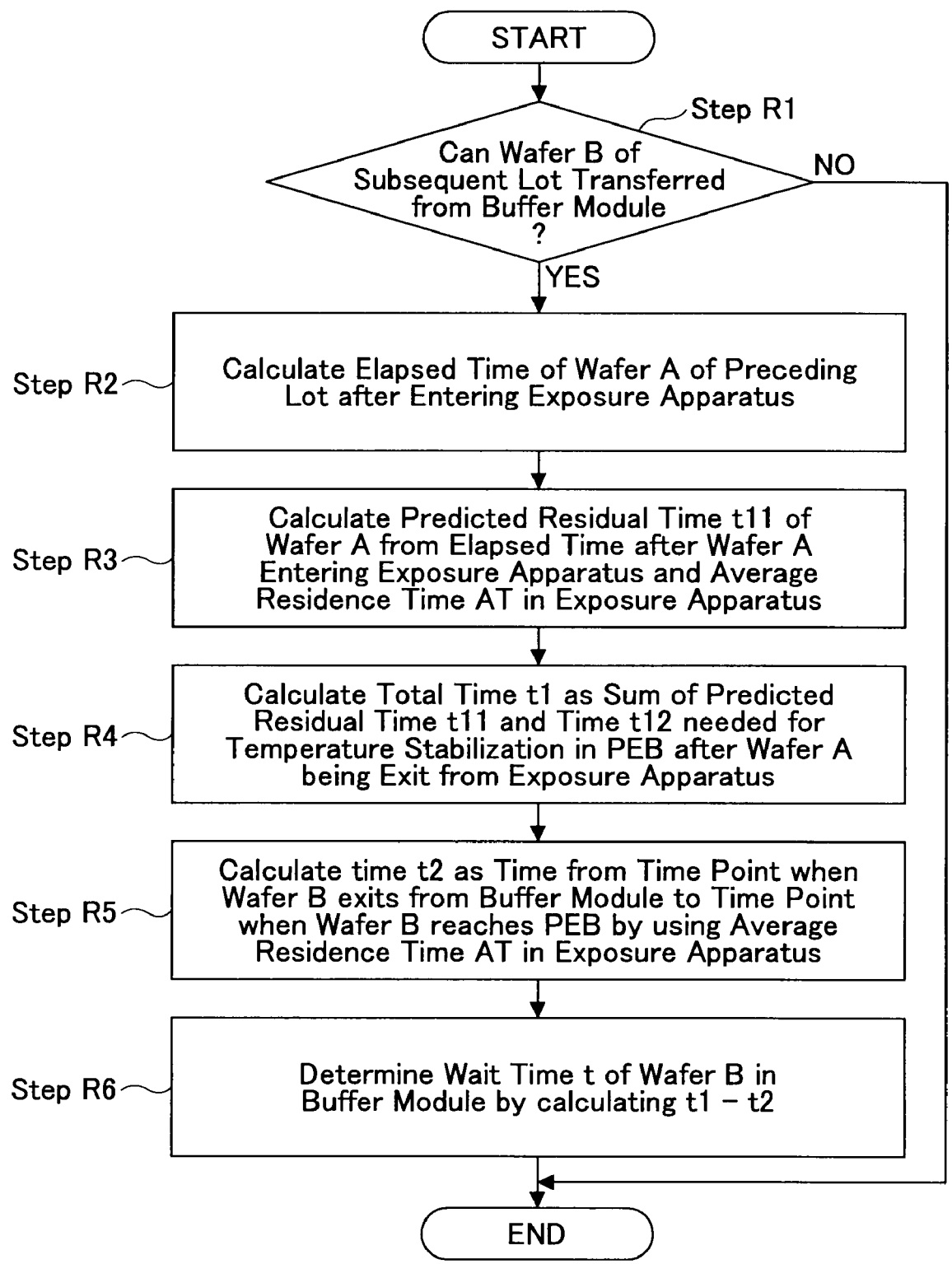
FIG. 6 is a flowchart showing the process of determining the waiting time in the buffer module.

As shown in FIG. 4, determination of the waiting time t is necessary for enabling transfer of the first wafer of the subsequent lot to one of the PEB1-PEB4 with the timing generally coincident to the timing of completion of temperature stabilization in that PEB after baking processing of the last wafer of the preceding lot and subsequent temperature adjustment have been carried out therein. Further, FIG. 5 is a flowchart showing the process steps for calculating an average residence time AT of wafers in the exposure apparatus for use in the calculation of the waiting time t, while FIG. 6 is a flowchart showing the process steps for calculating the waiting time t. Hereinafter, the average residence time AT of wafers in the exposure apparatus may also be designated as residence time t3 in the exposure apparatus.

For the convenience of explanation, the carrier to be loaded in at first after activation of the coating and developing apparatus will be designated as "carrier C1", and the carrier that is loaded subsequent to the carrier C1 will be designated as "carrier C2". Further, the 25 wafers in the carrier C1 that are transferred into the coating and developing apparatus at first for processing will be designated as A1-A25 according to the order of transfer, and the 25 wafers in the carrier C2 that are transferred into the coating and developing apparatus for processing will be designated, according to the order of transfer, as B1-B25. In the coating and the developing apparatus 1 and in the exposure apparatus 4, it is assumed that there occurs no overtaking in the transfer of the wafers, and thus, the wafers A1-A25 and the wafers B1-B25 are transferred into the exposure apparatus 4 with this order and transferred out therefrom with the same order. After the first wafer A1 is transferred into the PEB4, the subsequent wafers A and B are transferred into the PEB1-PEB4 by repeating this order, and thus, the PEB1 is brought in with the wafers A22 and B1, the PEB2 is brought in with the wafers A23 and B2, the PEB3 is brought in with the wafers A24 and B3, and the PEB4 is brought in with the wafers A25 and B4. Reference should be made to FIG. 7. In FIG. 7, it should be noted that the time for the main transfer units 2A and 3A making one round or cycle of the transfer path is defined as "one cycle".

There, it should be noted that each of PEB1-PEB4 applies a baking processing of 130° C. to the wafer A, for example, and after completing the baking processing to the wafers A22-A25, each of PEB1-PEB4 sets the temperature of the hot plate therein to a temperature of 90° C. for processing the wafer B1 and the wafers following the wafer B1. The time needed for this temperature stabilization and the processing time for PEB1-PEB4 and ICPL is stored in the control part 100 by being input by an operator via the input screen in advance, while the transfer time for the transfer processes of: buffer module BM→ICPL, ICPL→feed-in port 41 of exposure apparatus 4, feed-out port 42 of exposure apparatus 4→TRS, and TRS→respective PEBs, is acquired by the control part 100 and stored therein before the calculation of the waiting time t.

First, the coating and developing apparatus 1 is turned on and the operator sets the upper limit time of the wafer resident time in the exposure apparatus upon activation of the apparatus 1. Further, the carrier C1 is transferred to the coating and developing apparatus 1, and the wafer A1 is transferred from the carrier block 11 to the exposure apparatus 4 along the path explained already. The exposure apparatus 4 is in the ready-to-accept state, and when the wafer A1 is brought into the feed-in port 41 of the exposure apparatus 4, the control part 100 memorizes the reception time. There, the wafer A1 is transferred to a predetermined location in the exposure apparatus from the feed-in port 41, and the wafer A2 is brought subsequently into the feed-in port 41 along the path noted before. Thereby, the control part 100 memorizes the reception time of the wafer A2 and the wafer A2 is then transported to a predetermined location within the exposure apparatus 4. Next, the wafers A3 and A4 are brought into the feed-in port 41 consecutively, while when the wafer A4 is brought into the feed-in port 41, the exposure apparatus 4 becomes the state in which further transfer of wafers thereto is not possible. Thereby, the control part 100 memorizes the reception time also for the wafers A3 and A4 (step S1 of FIG. 5). The wafers A3 and A4 transferred to the feed-in port 41 are moved to the respective, predetermined locations in the exposure apparatus 4.

Next, a subsequent wafer is transferred from the carrier block 11 along the foregoing path but with a predetermined interval to the buffer module BM and waits in that buffer module BM. Meanwhile, the exposure process of the wafer A1 is finished and the wafer A1 is moved to the feed-out port 42. With this, the wafer A1 becomes the state ready to feed out from the exposure apparatus 4. When this state appears, the control part 100 judges as to whether or not the reception time for the wafer A1 to the feed-in port 41 is acquired (step S2). When it is judged that the reception time is not acquired, the wafer A1 is memorized as the wafer as a wafer out of the wafer group subjected to a summing up process of the residence time conducted for the purpose of calculating the average residence time AT of wafers in the exposure apparatus. For the wafer A1, the steps S3-S8 to be described below are not executed.

On the other hand, when it is judged that the reception time is acquired, the control part 100 judges as to whether or not there is a signal output from the exposure apparatus 4 indicating that the wafer A1 is an anomalous wafer (step S3), and if it is judged that such a signal is provided, the wafer A1 is memorized as a wafer out of the wafer group used for the summing up process of the residence time. Thereby, the steps S4-S8 are not executed for the wafer A1. On the other hand, when it is judged that there is no such a signal, the control part 100 memorizes the time from the reception time at which the wafer A1 is brought into the feed-in port 41 to the time when the wafer A1 has become ready to be taken out (the time until the out-ready signal is output). In other words, the control part 100 memorizes the residence time of the wafer A1 in the exposure apparatus (step S4). Further, the control part 100 judges as to whether or not the time thus calculated is within the preset upper limit time (step S5).

Now, when it is judged that the calculated time exceeds the predetermined upper limit time, the control part 100 memorizes the wafer A1 as a wafer out of the wafer group used for the summing up process of the residence time t, and the steps S6 and S7 are not executed for the wafer A1. On the other hand, when the calculated time is within the upper limit time, the control part 100 memorizes the wafer A1 as the wafer subjected to the summing up process of residence time for calculating the residence time t (step S6), and the acquired residence time in the exposure apparatus is summed up for each of the wafers subjected to the summing up process of residence time (step S7). Further, the summed up value of the residence time is divided by the number of the wafers subjected to the summing up process, and the time thus divided is stored as the average residence time of wafer in the exposure apparatus (step S8). In the present instance, the residence time in the exposure apparatus is calculated only for the wafer A1, and thus, the residence time of the wafer A1 is divided by the number "1" indicating the number of the wafer. Thus, the residence time of the wafer A1 in the exposure apparatus itself is stored as the average residence time AT of wafers in the exposure apparatus.

When the wafer A1 on the feed-out port 42 is taken out from the exposure apparatus by the transfer part 5A, the exposure apparatus 4 becomes a state ready to accept a new wafer. Thus, the wafer A1 is transferred to the PEB 4 along the foregoing path for heating and is returned to the carrier C1 after the heating, while a wafer A5 is taken out from the buffer module BM by the transfer part 4A and the wafer A5 is transferred to the feed-in port 41 via ICPL. The control part 100 memorizes the reception time of the wafer A5 when the wafer A5 is transferred to the feed-in port 41, similarly to the case of the wafers A1-A4.

Subsequently, an exposure process of the wafer A2 is finished, and the wafer A2 is transferred to the feed-out port 42. With this, the control part 100 executes the process of the steps S2 through S5 noted before. Thus, when the wafer A2 is memorized as the wafer for the summing up process of residence time (step S6), the residence time of the wafer A2 in the exposure apparatus is calculated and the residence time thus calculated is added to the total residence time of the wafers acquired so far. The total residence time thus updated is then divided by the total number of the wafers under the measurement (step S7) and the divided value is used to update the average residence time AT of wafers in the exposure apparatus (step S8). By this time, it is already judged as to whether or not the wafers A1 and A2 are the wafers subjected to the summing up process, and thus, the residence time is calculated for each of the wafers A1 and A2 in the event the wafers A1 and A2 are the wafers subjected to the summing up process of residence time. There, the total time thus obtained is divided by the number "2" indicating the total number of the wafers, and the value thus obtained is used to update the value of the average residence time AT of wafers in the exposure apparatus. Further, when the wafer A2 is the sole wafer subjected to the summing up process of residence time, the residence time of the wafer A2 in the exposure apparatus is divided by the number "1", and thus, the residence time of the wafer A2 in the exposure apparatus itself is used for the average residence time AT of wafers in the exposure apparatus. On the other hand, when it is judged that the wafer A2 is not the wafer subjected to the summing up process of residence time, the average residence time AT of wafers in the exposure apparatus calculated so far remains as it is and is not updated.

When the wafer A2 loaded upon the feed-out port 42 is taken out from the exposure apparatus 4 by the transfer part 5A, the exposure apparatus 4 becomes the state ready to accept a new wafer, and the wafer A2 is transferred to the PEB1 along the path noted before for heating. After the heating process, the wafer A2 is returned to the carrier C1, while a new wafer A6 is taken out from the buffer module BM by the transfer part 4A. The wafer A6 is then transferred to the feed-in port 41 along the path explained already, and the reception time is memorized for the wafer A6.

Next, the wafer A3 is loaded upon the feed-out port 42, and when the wafer A3 is ready to be taken out from the exposure apparatus 4, the process of the steps S2-S5 is executed. There, when the wafer A3 is memorized as the wafer subjected to the summing up process of residence time (step S6), the residence time in the exposure apparatus are summed up for those wafers A judged as being the subject of the summing up process of residence time including the wafer A3, and the summed up value is divided by the total number of the wafers subjected to the summing up process of residence time (step S8). Thereby, the value thus divided is used to update the average residence time AT of wafers in the exposure apparatus. On the other hand, when it is not judged that the wafer A3 is the wafer subjected to the summing up process of residence time, the average residence time AT of wafers in the exposure apparatus calculated so far remains as it is and is not updated.

Thus, the reception time is acquired for each of the wafers A and it is judged whether the wafer A is the wafer subjected to the summing up process of the residence time each time a wafer A is loaded upon the feed-out port 42 of the exposure apparatus A. When it is judged that the wafer A is a wafer subjected to the summing up process, the total residence time so far of the wafers judged as being the wafers for the summing up process is calculated. The total residence time thus calculated is then divided by the number of the wafers used for the summing up process, and the divided value thus obtained is used to update the average residence time AT of wafer in the exposure apparatus. In the event it is judged that the wafer A loaded upon the feed-out port 42 is not the wafer for the summing up process, the average residence time AT of wafers in the exposure apparatus calculated so far remains unchanged.

Further, the transfer of the wafers A is continued consecutively, and thus, the wafers A22-A25 are transferred consecutively from the buffer module BM to the feed-in port 41. Thereby, the reception time thereof is memorized by the control part 100, and the wafers B1-B4 are introduced consecutively in to the buffer module BM. Next, when it is judged that transfer of the wafer B1 by the transfer part 4A out from the buffer module BM is possible (step R1 of FIG. 6), the control part 100 calculates an elapsed time t4 after reception, defined as the time from the reception of the wafer A22 to the feed-in port 41 to the time point P1 in which the wafer B1 is ready form being taken out from the buffer module BM (step R2), and the elapsed time t4 is subtracted from the average residence time AT of wafers in the exposure apparatus calculated for the time point P1. Thereby, the time AT−t4 is determined as a predicted residual time t11 of the wafer A22 in the exposure apparatus 4 (step R3).

Next, the control part 100 sums up the predicated residual time t11, a time t12, which is the time needed for the wafer A22, transferred to the PEB1 after being taken out from the feed-out port 41, is heated in the PEB1, and further a time t12 needed for the PEB1 to stabilize the temperature of the hot plate used therein for heating the wafer B1 after finishing the baking process of the previous wafer A22, and a total time thus obtained is defined as a time t1 needed for the PEB1 to become ready for baking the wafer B1 as measured from the foregoing time point P1 (step R4). Further, the control part 100 sums up a time t21 representing the time needed for the wafer B1 to be transferred to the feed-in port 41 after being taken out from the buffer module BM and a time t23 representing the time needed for the wafer B1 taken out from the feed-out port 42 reaches the PEB1, and a total time t2 thus obtained is defined as the time for the wafer B1 to reach the PEB1 from the buffer module BM (step R5). Thereafter, the control part 100 calculates t1−t2 and obtains a time t as the waiting time for the wafer B1 waiting in the buffer module BM as measured from the time point P.

Figure 8:
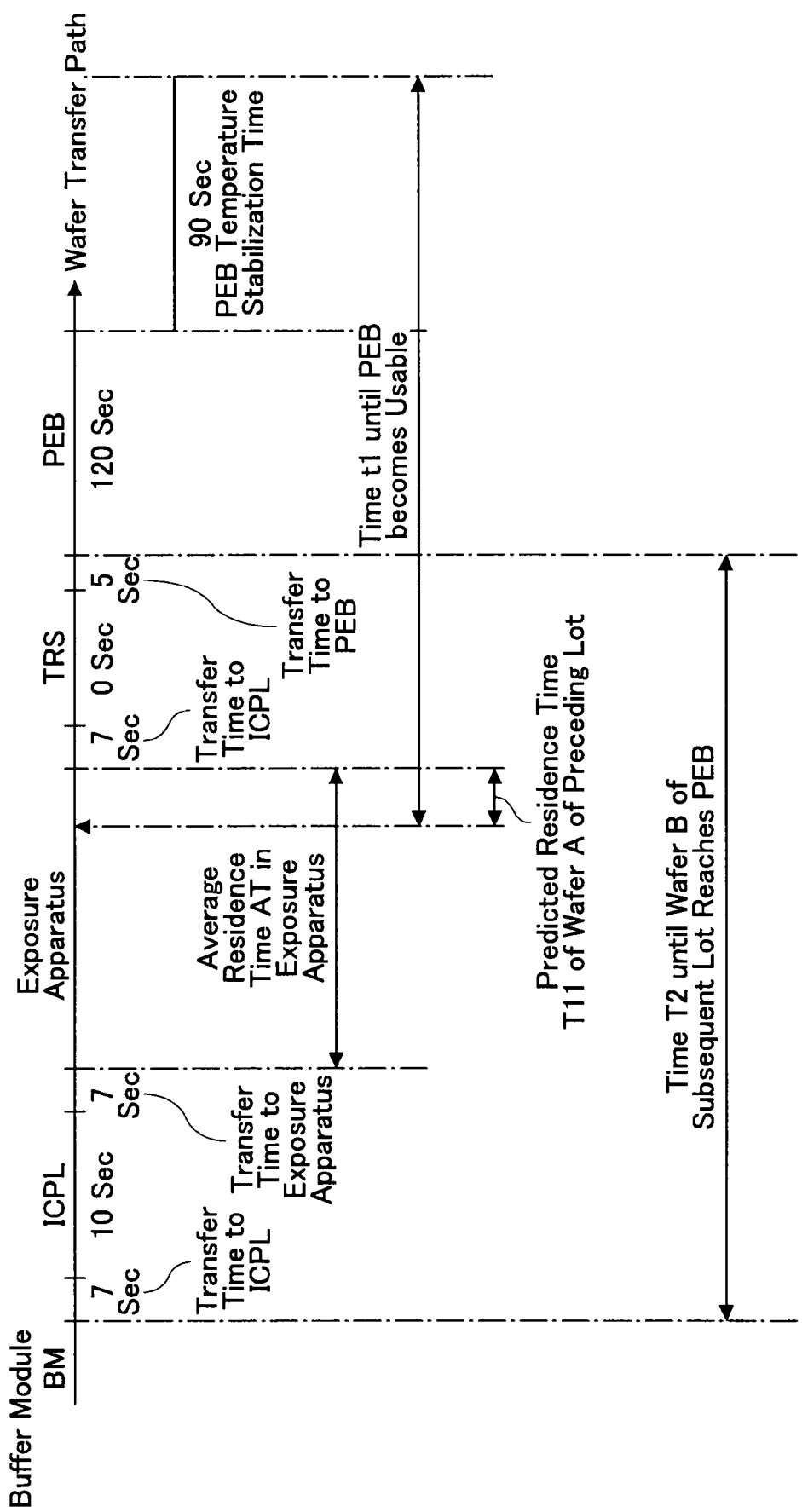
FIG. 8 is a time chart showing the processing time for each module and the transfer time between the modules.

In the practical example shown in FIG. 8, it should be noted that the process of buffer module BM→ICPL requires a transfer time of 7 seconds, the process of ICPL→feed-in port 41 of exposure apparatus 4 requires a transfer time of 7 seconds, the process of feed-out port 42 of exposure apparatus 4→TRS requires a transfer time of 7 seconds, and the process of TRS→PEB1 requires a transfer time 5 seconds, the IPCL3 requires a processing time of 10 seconds, the PEB1 requires a processing time of 120 seconds, the residence time in the TRS is 0 seconds, and the time needed for the PEB1 for the temperature stabilization is 90 seconds. In the case that the average wafer residence time AT of wafers in the exposure apparatus 4, calculated for the time point P1 in which the wafer B1 has become ready for being taken out from the buffer module BM, is 100 seconds and that the elapsed time t4 from the reception of the wafer A22 at the feed-in port 41 to the time point P1 is 60 seconds, the control part 100 determines the predicted residual time of the wafer A22 in the exposure apparatus as 100 seconds−60 seconds=40 seconds.

Next, the control part 100 calculates the time t1 as t1= (predicted residual time t11)+(transfer time of feed out port 42→TRS)+(resident time in TRS)+(transfer time of TRS→PEB1)+(heating time in PEB1)+(stabilization time of PEB1)=40 seconds+7 seconds+0 seconds+5 seconds+120 seconds+90 seconds. There, the calculated time of 262 seconds is determined as the time t1, which is needed for the PEB1 to stabilize the temperatures thereof and ready for the processing of the wafer B1 as measured from the time point P1.

Further, the control part 100 calculates the time t2 as t2= (transfer time of buffer module BM→ICPL)+(processing time in ICPL)+(transfer time of ICPL→feed-in port 41 of exposure apparatus 4)+(residence time t3 in exposure apparatus 4)+(transfer time of feed-out port 42→TRS)+(residence time in TRS)+(transfer time of TRS→PEB1)=7 seconds+10 seconds+7 seconds+100 seconds+7 seconds+0 seconds+5 seconds. There, the calculated time of 136 seconds is determined as the time t2, which is needed for the wafer B1 to reach the PEB 1 after being transferred out from the buffer module BM. Thereby, the control part 100 determines the wait time t measured from the time point P1 as t=t1−t2=262 seconds−136 seconds=126 seconds. Meanwhile, it should be note that the sum of: (transfer time of buffer module BM→ICPL)+(processing time in ICPL)+(transfer time of ICPL→feed-in port 41 of exposure apparatus) corresponds to the foregoing time t21; while the sum of: (transfer time of feed-out port 42→TRS)+(resident time in TRS)+(transfer time of TRS→PEB1) corresponds to the foregoing time t23.

Thus, with regard to the wafer B1 for which calculation of the waiting time has been made is not transferred out from the buffer module BM even when the exposure apparatus 4 has become the state ready to feed in, until the foregoing waiting time t elapses as measured from the time point P1, while when the time t has elapsed, the wafer B1 is transferred by the transfer part 4A from the buffer module BM to the ICPL. Thereafter, the wafer B1 is transferred to the feed-in port 41 similarly to each wafer of the wafers A. After the exposure process, the wafer B1 is transferred to the TRS along the path noted above. At the moment when the wafer B1 is transferred to the TRS, the control part 100 judges as to whether or not the temperature stabilization of the PEB1 is finished concurrently to or before the transfer of the wafer B1 from the TRS to the PEB1, and when it is judged YES, the control part 100 causes the transfer of the wafer B1 to the PEB1 as is scheduled. On the other hand, when it is judged NO, the wafer B1 is retained in the TRS and is transferred from the TRS to the PEB1 for the first time when the temperature stabilization in the PEB1 has been completed. Thereby, the wafer B1 is heated in the PEB1 and is returned to the carrier C2 along the path explained before.

Further, at the time P2 in which the transfer part 4A is ready to transfer the wafer B2 out from the buffer module BM, the control part 100 calculates the time t1 from the time point P2 to the time point in which the PEB2 is ready for the baking processing of the wafer B2 and the time t2 in which the wafer B2 is transferred out from the buffer module BM and reaches the PEB2 according to the steps R1-R6 similarly to the case of the wafer B1. Thereafter, the waiting time t for the wafer B2 is determined. Further, with regard to the wafers B3 and B4, the waiting time t is determined as the waiting time in the buffer module respectively from the time points P3 and P4, in which the time point P3 represents the time point when the transfer part 4A has become ready to transfer the wafer B3 out from the buffer module BM while the time point P4 represents the time point when the transfer part 4A has become ready to transfer the wafer B4 out from buffer module BM. Further, the wafers B3 and B4 are transferred out from the buffer module BM according to the respective waiting time t. With regard to the wafers of B5 or later, the wafers are transferred out from the buffer module BM when the exposure apparatus 4 has become ready-to-accept state (in-ready signal is output).

Further, with regard to the wafers B, the control part 100 memorizes the reception time of the wafers to the feed-in port 41 for each of the wafers B, and the value of the average residence time AT of wafers in the exposure apparatus is updated also during the time in which the wafers B2-B4 are waiting in the buffer module BM. Thereby, the calculation of the waiting time t of the wafers B2-B4 is carried out based on the average residence time AT of wafers in the exposure apparatus thus updated.

According to the coating and developing apparatus 1 of the present embodiment, the average residence time AT of wafers in the exposure apparatus 4 is determined for the wafers A of the preceding lot, by calculating the time interval from the time when they are accepted at the feed-in port 41 of the exposure apparatus 4 to the time point when they are loaded upon the feed out port 42. Thus, the predicted residual time t11 of the wafers A22-A25 of the preceding lot in the exposure apparatus 4 is calculated from the time points P1-P4, in which the wafers B1-B4, the waiting time t of the wafers B1-B4 being the subject of calculation, have become ready to be taken out, based on the average residence time AT of wafers in the exposure apparatus. Further, by using the predicted residual time t11, the time t1 for finishing the baking processing of the wafers B1-B4 after temperature stabilization in the PEB1-PEB4, is calculated for each of the wafers B1-B4 as measured from the time points P1-P4. Further, the time t2 for the wafers B1-B4 being transferred from the buffer module BM to the exposure apparatus 4 and transferred further to the PEB1-PEB4 after the exposure process is calculated based upon the average residence time AT of wafers in the exposure apparatus. Subsequent thereto, the residence time t of the wafers B1-B4 in the buffer module BM is calculated by calculating t1−t2. By carrying out the transfer for each of the wafers B1-B4 based upon the residence time t thus calculated, it becomes possible to transfer the respective wafers B1-B4 out from the buffer module BM such that the discrepancy of time between the time of completion of temperature stabilization in any of the PEB1-PEB4 and the time at which the respective wafers B1-B4 arrive at corresponding one of the PEB1-PEB4, and thus, the time of the wafers B1-B4 staying unnecessarily in the buffer module BM is suppressed. Thereby, decrease of the throughout can be suppressed. Further, by reducing the time after the temperature stabilization of the PEB1-PEB4 until the wafers B1-B4 are transferred, it becomes possible to suppress the consumption of electric power used for heating the wafers.

Further, with the present embodiment, it should be noted that the average residence time AT of wafers in the exposure apparatus is updated each time a new wafer is accepted at the feed-in port 42 while excluding the wafers having anomaly or for the wafers of which residence time has exceeded a preset upper time limit for the calculation of the average residence time AT of wafers in the exposure apparatus, it becomes possible to obtain the average residence time AT of wafers in the exposure apparatus with high precision. Thereby, it becomes possible to calculate the waiting time t of the wafers B1-B4 in the buffer module BM with high precision.

Here, a situation is considered in which the waiting time t of the wafer B1 in the buffer module BM is calculated under the assumption that the predicted residual time t11 of the wafer A22 in the exposure apparatus 4 and the average residence time of wafers in the exposure apparatus are 0 seconds as in the case of the related art while using the values obtained before for the transfer time between the modules and the processing time in the respective modules.

In this case, the time from the time point P1 until the PEB1 is ready for baking processing of the wafer B1 is given as t1=(predicted residual time t11)+(transfer time of feed-out port 42→TRS)+(residence time in TRS)+(transfer time of TRS→PEB1)+(baking processing time in PEB1)+(temperature stabilization time in PEB)=0 seconds+7 seconds+0 seconds+5 seconds+120 seconds+90 seconds=222 seconds. Further, the time t2 from the time when the wafer B1 is taken out from the buffer module BM and to the time when the wafer B1 reaches the PEB1 is given as t2=(transfer time of buffer module BM→ICPL)+(transfer time of ICPL→feed-in port 41 of exposure apparatus 4)+(residence time in exposure apparatus 4)+(transfer time of feed-out port 42→TRS)+(residence time in TRS)+(transfer time of TRS→PEB1)=7 seconds+10 seconds+7 seconds+0 seconds+7 seconds+0 seconds+5 seconds=36 seconds. Thus, the waiting time t in the buffer module BM is given as t=t1−t2=222 seconds−36 seconds=186 seconds. Because the waiting time is 126 seconds according to the present embodiment, it will be noted that the waiting time is reduced by 186 seconds−126 seconds=60 seconds. Thus, the calculation method of the present invention is effective for improving the throughput.

Second Embodiment

Next, another example of transfer method in the coating and developing apparatus 1 noted above will be explained as a second embodiment, wherein the explanation will be made only for the difference over the transfer method of the previous embodiment. It is assumed that the coating and developing apparatus 1 includes six of post exposure baking units PEB1-PEB6 in the shelf unit U3. As will be explained later, the control part 100 is capable of calculating and determining the time interval from the time point in which the hot plate is in the waiting state in each of the PEBs until the time point in which the hot plate has increased the temperature thereof to a predetermined temperature for applying the baking process to the wafer W. Further, it is assumed that the wafer B1 is transferred to any of the PEB1 and PEB5 and the wafer B2 is transferred to any of PEB2 and PEB6.

For example, after turning the coating and developing apparatus 1 on, the hot plates are heated in the PEB1-PEB4 to a predetermined temperature of 130° C., for example, used for baking the wafers A and are thus ready for the baking process, while in the PEB5 and PEB6, the hot plates therein are in the idling state at the temperature of about 50°. There, the wafers A1-A25 are transferred from the carrier C1 to the exposure apparatus 4, wherein the control part 100 calculates, at a time point P1 in which the wafer B1 is ready to be taken out from the buffer module BM for transfer, the time t1' needed for heating the hot plate in the PEB 5 to a predetermined temperature such as 90° C. used for baking the wafer B1. Further, the control part 100 judges as to whether or not the foregoing time t1' is longer than the total time of the predicted resident time t11 of the wafer A22 in the exposure apparatus a time 12 for the PEB 1 to finish the baking process of the wafer A22 and stabilize the temperature thereof for baking the wafer B1.

When the control part 100 has judged that the time t1' is longer than t11+t12, the waiting time t is determined for the wafer B1 similarly to the first embodiment and the temperature of the PEB1 is stabilized. Further, the wafer B1 is transferred to the PEB1. On the other hand, in the case the control part 100 has judged that t1' is shorter than t11+t12, the control part 100 causes the hot plate of the PEB5 to increase the temperature to the temperature used for baking the wafer B1, and at the same time, sets the time t1' to be equal to a time t1 needed from the time point P1 until the PEB5 is ready for carrying out the baking process. Further, the control part 100 determines the time measured from the time point of taking the wafer B1 out from the buffer module BM until the wafer B1 reaches the PEB5 as t2. Next, the control part 100 calculates t1−t2 as noted before, and used the calculated value as the waiting time t of the wafer B1 in the buffer module BM. Thus, after the waiting time t has elapsed, the wafer B1 is introduced into the exposure apparatus 4 similarly to the previous embodiment and further to the PEB5 via the TRS for the baking processing.

Thereafter, at the time point P2 in which the wafer B2 is ready to be taken out from the buffer module BM, the control part 100 calculates the time t1' needed for the hot plate of the PEB6 to increase the temperature thereof to 90° C., wherein the control part 100 judges as to whether or not the time t1' is longer than the total time of the predicted resident time t11 of the wafer A23 in the exposure apparatus and the time t12 needed for the PEB2 to stabilize the temperature thereof for baking the wafer B2 after completion of the baking process of the wafer A23 in the PEB2. When it is judged that t11+t12 is shorter than the time t1', the temperature of the PEB2 is stabilized similarly to the previous embodiment and the wafer B2 is transferred to the PEB2. On the other hand, when it is judged that the time t11+t12 is longer than the time t1', the temperature of the hot plate in the PEB6 is elevated and the wafer B2 is transferred to the PEB6.

Further, when the wafer B3 has become possible to be taken out from the buffer module BM at a time point P3, the control part 100 selects one of the PEBs that are used for processing the wafers A of the preceding lot, such that the selected PEB is the one that transfers out the wafer with the earliest timing, and the times t1 and t2 are calculated of the PEB thus selected similarly to the previous embodiment. Thus, in the case the wafers B1 and B2 are transferred respectively to the PEB5 and PEB6, for example, it is determined that the wafer B3 is transferred to the PEB1, in which the baking processing of the wafer A is finished at first among the PEB1-PEB4, and the waiting time t is calculated such that the wafer B1 can be transferred to the PEB1 thus selected. In the case the wafers B1 and B2 are transferred to PEB1 and PEB2, it is determined that the wafer B3 is transferred to the PEB3 similarly to the first embodiment noted before, and the waiting time t is calculated such that the wafer B3 can be transferred to the PEB3.

Figure 9:
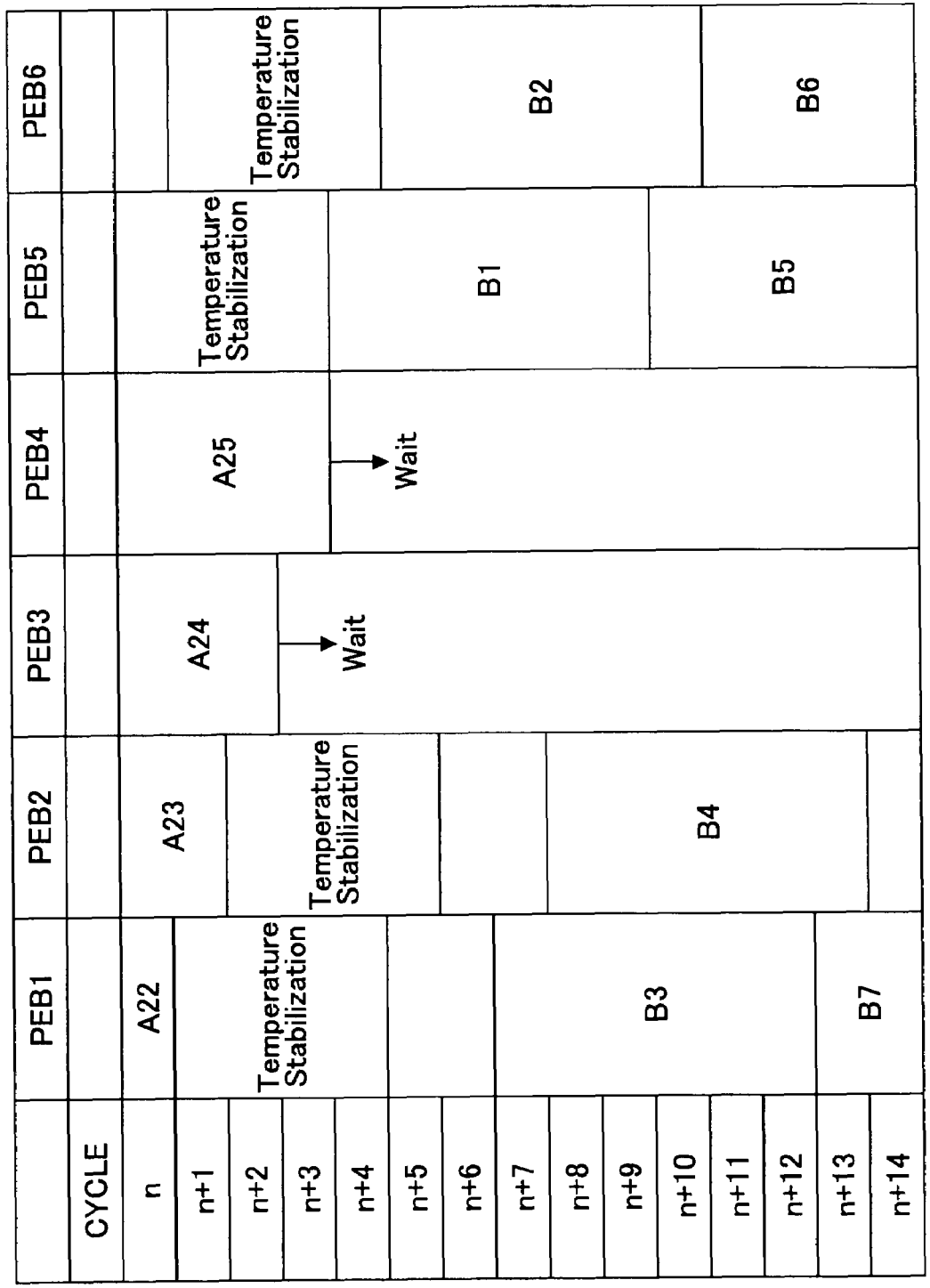
FIG. 9 is a transfer table showing the heating unit to which the wafers are transferred after the exposure process according to a second embodiment.

With regard to the wafer B4, the destination PEB is determined such that the destination PEB finishes the feeding out of the current wafer A with the earliest timing similarly to the case of the wafer B3, except for the PEBs that have already been selected for the transfer destination of the wafer B3. There, the waiting time t is determined for the wafer B4 such that the wafer B4 can be transferred to the PEB thus selected. Thus, in the event it is determined that the wafer B3 is transferred to the PEB1 as shown in FIG. 9, the PEB2 is selected for the wafer B4. It should be noted that the PEB2 is the PEB that transfer the wafer A out next to the earliest PEB1. With regard to the wafer B5 and the wafers thereafter, the wafers are transferred to the PEBs for processing the wafers B1-B4 consecutively, while the PEBs not provided with the wafer B are held in the idling state. For example, in the case the wafers B1 and B2 are transferred respectively to the PEB5 and PEB6, the PEB3 and the PEB4 become the idling state after processing the wafers A24 and A25 of the preceding lot. In the case the wafers B1 and B2 are transferred respectively to the PEB3 and PEB4, on the other hand, the PEB5 and PEB6 maintain the idling state.

According to the second embodiment, too, an effect similar to the first embodiment is obtained, and it is possible to attain the desirable effect of reducing the resident time of the wafers B in the buffer module BM, by directing the wafer B of the subsequent lot to the PEB selected from the PEB1-PEB4 such that processing of the wafer A of the preceding lot is finished early and it is possible to start the temperature stabilization process with advanced timing.

Further, in each of the foregoing embodiments, the average residence time AT of wafers in the exposure apparatus memorized in the control part 100 is reset upon turn off of electric power for the coating and developing apparatus 1. Thus, upon restart, the average residence time AT of wafers in the exposure apparatus is acquired again from the wafers of the lot which are transferred after power on with restart. It is of course possible to save the data of the residence time AT thus acquired by sending the same to a host computer that controls the transfer of the carrier C to the coating and developing apparatus 1 before turning off of the electric power of the coating and developing apparatus 1. Thereby, the data thus saved in the host computer is read out therefrom upon restart of the coating and developing apparatus 1. In such a case, it is also possible to construct such that the average residence time AT of wafers in the exposure apparatus is memorized according to the processing conditions such as the line width of the resist patterns used for the respective lots. Thereby, it becomes possible to send the average residence time AT corresponding to the processing condition of the wafers transferred to the coating and developing apparatus 1, to the control part 100. Thus, it is possible to acquire the average residence time AT of wafers in the exposure apparatus also via communication.

Further, in the event the average residence time AT of wafers in the exposure apparatus is not determined by the time points P1-P4, at which it becomes possible to take out the wafers B1-B4 from the buffer module BM, it is possible for the control part 100 to determine the waiting time t of the wafer B1 by carrying out the calculation explained before by assuming that the average residence time AT of wafers in the exposure apparatus is 0 seconds and the predicted residual time t11 of the wafer A of the preceding lot is 0 seconds.

Next, by using a simulator, a comparison was made with regard to the transfer of wafers for the case in which the predicted residual time of wafer A in the exposure apparatus and the average residence time of wafer B in the exposure apparatus are 0 seconds (case 1) and for the case in which the wafer transfer is carried out by calculating the residence time of wafers in the exposure apparatus as in the case of the first embodiment (case 2). While the wafer transfer is carried out with this simulation similarly to the first embodiment, there are provided the PEB1-PEB6 in the shelf unit U3 and the wafers of the respective lots are transferred consecutively to the PEB1-PEB6.

FIG. 12 shows the results of the simulation, wherein the numerals in the brackets for the columns of PEB represent the vacant time of the respective PEBs calculated by subtracting 90 seconds corresponding to the time for temperature stabilization from the numerals outside the brackets of the same column. As can be seen in the table of FIG. 12, the waiting time for the buffer module BM is reduced by 82 seconds with the case 2 as compared with the case 1, and the time for finishing the processing of the wafer B is reduced by 84 seconds with the case 2 as compared with the case 1. Thus, it is demonstrated that the embodiments described heretofore can provide improved throughput. Further, the vacant time (time in which no wafer is introduced) is reduced for the PEB1-PEB6 with the case 2, while this means that it is possible to reduce the power consumption for each of the PEBs.

While the present invention has been explained for preferred embodiments, the present invention is not limited to such specific embodiments and various variations and modifications may be made within the scope of the invention described in patent claims.

What is claimed is:

1. A coating and developing apparatus carrying out coating of a resist film upon a substrate taken out from a carrier fed into a carrier block, said coating and developing apparatus further applying a developing process to a substrate finished with an exposure process in an exposure apparatus, said coating and developing apparatus further carrying out, after processing of substrates of a preceding lot, processing of substrates of a subsequent lot, said coating and developing apparatus comprising:

a wait module in which a substrate coated with a resist film and ready for an exposure process waits for transfer;

a transfer unit transferring said substrate waiting in said wait module to a feed-in port of said exposure apparatus, said transfer unit being further fed with a substrate finished with an exposure process from a feed-out port of said exposure apparatus and transferring to a selected heating module selected from a plurality of heating modules;

a calculation unit calculating, during said processing of substrates of said preceding lot, a timing for transferring out a first substrate of said subsequent lot to be processed with said heating module from said wait module for each of said plurality of heating modules;

a control unit controlling said transfer unit such that a first substrate of said subsequent lot is transferred out from said wait module with a timing calculated with said calculation unit, wherein said calculation unit obtains, for a current heating module included in said plurality of heating modules, a waiting time t defined as a time interval from a time point in which a first substrate B1 of said subsequent lot to be processed by said current module at first has become ready for being transferred out from said wait module to a time point in which said substrate B1 has been transferred out from said wait module, as $t = t1 - t2,$ t1 representing a time interval from said time point in which said substrate B1 has become ready for being transferred out from said wait module to a time point in which said current heating module has become ready for processing said substrate B1, t2 representing a time interval from said time point in which said substrate B1 has been transferred out from said wait module to a time point in which said substrate B1 has reached said current heating module, said calculation unit obtaining said time t1 as a sum of:

a predicted residual time t11 representing a time interval in which a substrate A1, which is a substrate of said preceding lot to be processed at last by said current heating module, remains in said exposure apparatus as measured from a first time point in which said substrate B1 has become ready to be transferred out from said wait module, to a time point in which said substrate A1 is transferred to a feed-out port of said exposure apparatus; and a time interval t12 from a time in which said substrate A1 is transported out from said feed-out port and processed with said current heating module after being transferred thereto, to a time in which said current heating module has become ready for processing said substrate B1 subsequent to said substrate A1, said calculation unit further obtaining said time t2 as a sum of:

a time interval t21 for said substrate B1 being transferred out from said wait module and introduced into said feed-in port of said exposure apparatus;

a time t3 for said substrate B1 residing in said exposure apparatus; and a time t23 for said substrate B1 being transferred out from said exposure apparatus and transferred to said current heating module, said calculation unit further calculating said residual time t3 in said exposure apparatus for each of said substrates that precede said substrate B1 from a time point of being transferred into said exposure apparatus to a time point of being transferred out from said exposure apparatus, said calculation unit calculating said predicted residual time t11 of said substrate A1 in said exposure apparatus as a time that remains after a time interval, measured from a time point in which said substrate B1 is introduced into said exposure apparatus to a time point in which said substrate B1 has become ready for being transferred out from said waiting module, has been subtracted from said residual time t3 of said substrate A1 in said exposure apparatus, said transfer unit transferring out said substrate B1 from said wait module at a time point in which said wait time t has been elapsed from said time point in which said substrate B1 has become ready for being transferred out from said wait module.

2. The coating and developing apparatus as claimed in claim 1, wherein said residence time t3 is a value obtained by accumulating a residence time for wafers processed with said exposure apparatus before said substrate B1 to calculate an accumulation value and dividing said accumulation value by a number of substrates used for accumulating said residence time, said residence time t3 being updated each time a substrate is transferred out from said exposure apparatus.

3. The coating and developing apparatus as claimed in claim 2, wherein an anomalous wafer and a wafer on which residence time in said exposure apparatus exceeds said upper limit time are excluded from said accumulation of residence time.

4. The coating and developing apparatus as claimed in claim 2, in which there is disposed a temperature adjustment module for adjusting a temperature of said substrate to a temperature inside said exposure apparatus, in a transfer path of substrates from said wait module to said feed-in port of said exposure apparatus.

5. The coating and developing apparatus as claimed in claim 2, wherein there is disposed a transfer module for transferring a substrate in a path of said substrate from said feed-out port of said exposure apparatus to said heating module.

6. The coating and developing apparatus as claimed in claim 2, wherein said plurality of heating modules include an unused heating module not used for processing of the substrates of said preceding lot, said calculation unit calculating, for a case in which said substrate B1 has used said unused heating module, a time t1' as calculated from a time point in which said B1 has become ready to be taken out from said wait module to a time point in which said unused heating module has become ready for baking said substrate B1, said calculation unit using one of said time t1' and a total time of said t11 and said t12 which is shorter, as said time t1 when calculating said waiting time t.

7. The coating and developing apparatus as claimed in claim 1, in which there is disposed a temperature adjustment module for adjusting a temperature of said substrate to a temperature inside said exposure apparatus, in a transfer path of substrates from said wait module to said feed-in port of said exposure apparatus.

8. The coating and developing apparatus as claimed in claim 1, wherein there is disposed a transfer module for transferring a substrate in a path of said substrate from said feed-out port of said exposure apparatus to said heating module.

9. The coating and developing apparatus as claimed in claim 1, wherein said plurality of heating modules include an unused heating module not used for processing of the substrates of said preceding lot, said calculation unit calculating, for a case in which said substrate B1 has used said unused heating module, a time t1' as calculated from a time point in which said B1 has become ready to be taken out from said wait module to a time point in which said unused heating module has become ready for baking said substrate B1, said calculation unit using one of said time t1' and a total time of said t11 and said t12 which is shorter, as said time t1 when calculating said waiting time t.

10. A substrate processing method for carrying out processing of substrates of a current lot subsequent to substrates of a preceding lot by using a coating and developing apparatus, said coating and developing apparatus comprising:

a wait module in which a substrate coated with a resist and ready for an exposure process waits for transfer;

a transfer unit transferring said substrate waiting in said wait module to a feed-in port of said exposure apparatus, said transfer unit being further transferred with a substrate finished with an exposure apparatus from a feed-out port of said exposure apparatus and transferring to a selected heating module selected from a plurality of heating modules; and a developing module carrying out a developing processing to a substrate heated with said heating module, said substrate processing method comprising the steps of:

calculating, during said processing of substrates of said preceding lot, a timing for transferring out a first substrate of said subsequent lot to be processed with said heating module from said wait module for each of said plurality of heating modules; and transferring out a first substrate of said subsequent lot form said wait module with a timing calculated by said calculating step, wherein said calculating step obtains, for a current heating module included in said plurality of heating modules, a waiting time t defined as a time interval from a time point in which a first substrate B1 of said subsequent lot to be processed by said current module at first has become ready for being transferred out from said wait module to a time point in which said substrate B1 has been transferred out from said wait module, as $t = t1 - t2$, t1 representing a time interval from said time point in which said substrate B1 has become ready for being transferred out from said wait module to a time point in which said current heating module has become ready for processing said substrate B1, t2 representing a time interval from said time point in which said substrate B1 has been transferred out from said wait module to a time point in which said substrate B1 has reached said current heating module, said calculating step obtaining said time t1 as a sum of:

a predicted residual time t11 representing a time interval in which a substrate A1, which is a substrate of said preceding lot to be processed at last by said current heating module, remains in said exposure apparatus as measured from a first time point in which said substrate B1 has become ready to be transferred out from said wait module, to a time point in which said substrate A1 is transferred to a feed-out port of said exposure apparatus; and a time interval t12 from a time in which said substrate A1 is transported out from said feed-out port and processed with said current heating module after being transferred thereto, to a time in which said current heating module has become ready for processing said substrate B1 subsequent to said substrate A1, said calculating step further obtaining said time t2 as a sum of:

a time interval t21 for said substrate B1 being transferred out from said wait module and introduced into said feed-in port of said exposure apparatus;

a time t3 for said substrate B1 residing in said exposure apparatus; and a time t23 for said substrate B1 being transferred out from said exposure apparatus and transferred to said current heating module, said calculating step further calculating said residual time t3 in said exposure apparatus for each of said substrates that precede said substrate B1 from a time point of being transferred into said exposure apparatus to a time point of being transferred out from said exposure apparatus, said calculating step calculating said predicted residual time t11 of said substrate A1 in said exposure apparatus as a time that remains after a time interval, measured from a time point in which said substrate B1 is introduced into said exposure apparatus to a time point in which said substrate B1 has become ready for being transferred out from said waiting module, has been subtracted from said residual time t3 of said substrate A1 in said exposure apparatus.

11. The substrate processing method as claimed in claim 10, wherein said residence time t3 is a value obtained by accumulating a residence time for wafers processed with said exposure apparatus before said substrate B1 to calculate an accumulation value and dividing said accumulation value by a number of substrates used for accumulating said residence time, said residence time t3 being updated each time a substrate is transferred out from said exposure apparatus.

12. The substrate processing method as claimed in claim 11, wherein an anomalous wafer and a wafer on which residence time in said exposure apparatus exceeds said upper limit time are excluded from said accumulation of residence time.

13. The substrate processing method as claimed in claim 12, in which there is disposed a temperature adjustment module for adjusting a temperature of said substrate to a temperature inside said exposure apparatus, in a transfer path of substrates from said wait module to said feed-in port of said exposure apparatus.

14. The substrate processing method as claimed in claim 11, in which there is disposed a temperature adjustment module for adjusting a temperature of said substrate to a temperature inside said exposure apparatus, in a transfer path of substrates from said wait module to said feed-in port of said exposure apparatus.

15. The substrate processing method as claimed in claim 11, wherein said plurality of heating modules include an unused heating module not used for processing of the substrates of said preceding lot, said calculation step of calculating, for a case in which said substrate B1 has used said unused heating module, a time t1' as calculated from a time point in which said B1 has become ready to be taken out from said wait module to a time point in which said unused heating module has become ready for baking said substrate B1, said calculation step using one of said time t1' and a total time of said t11 and said t12 which is shorter, as said time t1 when calculating said waiting time t.

16. The substrate processing method as claimed in claim 10, wherein said plurality of heating modules include an unused heating module not used for processing of the substrates of said preceding lot, said calculation unit calculating, for a case in which said substrate B1 has used said unused heating module, a time t1' as calculated from a time point in which said B1 has become ready to be taken out from said wait module to a time point in which said unused heating module has become ready for baking said substrate B1, said calculation step using one of said time t1' and a total time of said t11 and said t12 which is shorter, as said time t1 when calculating said waiting time t.

17. A computer-readable recording medium recorded with program code means for controlling a general purpose computer to carry out a substrate processing method, said substrate processing method carrying out processing of substrates of a current lot subsequent to substrates of a preceding lot by using a coating and developing apparatus, said coating and developing apparatus comprising: a wait module in which a substrate coated with a resist and ready for an exposure process waits for transfer; a transfer unit transferring said substrate waiting in said wait module to a feed-in port of said exposure apparatus, said transfer unit being further transferred with a substrate finished with an exposure apparatus from a feed-out port of said exposure apparatus and transferring to a selected heating module selected from a plurality of heating modules; and a developing module carrying out a developing processing to a substrate heated with said heating module, said substrate processing method comprising the steps of:

calculating, during said processing of substrates of said preceding lot, a timing for transferring out a first substrate of said subsequent lot to be processed with said heating module from said wait module for each of said plurality of heating modules; and transferring out a first substrate of said subsequent lot form said wait module with a timing calculated by said calculating step, wherein said calculating step obtains, for a current heating module included in said plurality of heating modules, a waiting time t defined as a time interval from a time point in which a first substrate B1 of said subsequent lot to be processed by said current module at first has become ready for being transferred out from said wait module to a time point in which said substrate B1 has been transferred out from said wait module, as $t = t1 - t2$, t1 representing a time interval from said time point in which said substrate B1 has become ready for being transferred out from said wait module to a time point in which said current heating module has become ready for processing said substrate B1, t2 representing a time interval from said time point in which said substrate B1 has been transferred out from said wait module to a time point in which said substrate B1 has reached said current heating module, said calculating unit obtaining said time t1 as a sum of:

a predicted residual time t11 representing a time interval in which a substrate A1, which is a substrate of said preceding lot to be processed at last by said current heating module, remains in said exposure apparatus as measured from a first time point in which said substrate B1 has become ready to be transferred out from said wait module, to a time point in which said substrate A1 is transferred to a feed-out port of said exposure apparatus; and a time interval t12 from a time in which said substrate A1 is transported out from said feed-out port and processed with said current heating module after being transferred thereto, to a time in which said current heating module has become ready for processing said substrate B1 subsequent to said substrate A1, said calculating step further obtaining said time t2 as a sum of:

a time interval t21 for said substrate B1 being transferred out from said wait module and introduced into said feed-in port of said exposure apparatus;

a time t3 for said substrate B1 residing in said exposure apparatus; and a time t23 for said substrate B1 being transferred out from said exposure apparatus and transferred to said current heating module, said calculating step further calculating said residual time t3 in said exposure apparatus for each of said substrates that precede said substrate B1 from a time point of being transferred into said exposure apparatus to a time point of being transferred out from said exposure apparatus, said calculating step calculating said predicted residual time t11 of said substrate A1 in said exposure apparatus as a time that remains after a time interval, measured from a time point in which said substrate B1 is introduced into said exposure apparatus to a time point in which said substrate B1 has become ready for being transferred out from said waiting module, has been subtracted from said residual time t3 of said substrate A1 in said exposure apparatus.

* * * * *